(12) United States Patent
McLaughlin et al.

(10) Patent No.: US 10,305,540 B2
(45) Date of Patent: May 28, 2019

(54) MEASURING ANGLE OF INCIDENCE IN AN ULTRAWIDEBAND COMMUNICATION SYSTEM

(71) Applicants: Michael McLaughlin, Dublin (IE); Billy Verso, Maynooth (IE)

(72) Inventors: Michael McLaughlin, Dublin (IE); Billy Verso, Maynooth (IE)

(73) Assignee: Decawave Limited (IE)

( * ) Notice: Subject to any disclaimer, the term of this patent is extended or adjusted under 35 U.S.C. 154(b) by 0 days.

(21) Appl. No.: 15/135,383

(22) Filed: Apr. 21, 2016

(65) Prior Publication Data

US 2016/0242135 A1 Aug. 18, 2016

Related U.S. Application Data

(63) Continuation-in-part of application No. PCT/EP2014/060722, filed on May 23, 2014, and a
(Continued)

(51) Int. Cl.
| | |
|---|---|
| *H04B 1/04* | (2006.01) |
| *H04B 1/7163* | (2011.01) |
| *H03M 1/34* | (2006.01) |
| *G01S 3/46* | (2006.01) |
| *H04B 1/7183* | (2011.01) |

(Continued)

(52) U.S. Cl.
CPC ........... *H04B 1/71637* (2013.01); *G01S 3/46* (2013.01); *G01S 3/48* (2013.01); *H03M 1/34* (2013.01); *H04B 1/7163* (2013.01); *H04B 1/7183* (2013.01); *G01S 3/14* (2013.01); *H03M 1/0607* (2013.01); *H04W 64/006* (2013.01)

(58) Field of Classification Search
CPC ..... G01S 3/46; G01S 3/48; G01S 3/14; H04B 1/7163; H04B 1/71637; H04B 1/7183; H03M 1/0607; H04W 64/006
See application file for complete search history.

(56) References Cited

U.S. PATENT DOCUMENTS

| | | | | |
|---|---|---|---|---|
| 5,541,608 A | * | 7/1996 | Murphy | G01S 3/023 342/174 |
| 5,724,047 A | * | 3/1998 | Lioio | G01S 3/50 342/417 |
| 6,366,241 B2 | * | 4/2002 | Pack | G01S 3/48 342/442 |
| 9,763,065 B2 | * | 9/2017 | Luo | H04W 4/08 |
| 2002/0011952 A1 | * | 1/2002 | Pack | G01S 3/48 342/442 |

(Continued)

*Primary Examiner* — Sophia Vlahos
(74) *Attorney, Agent, or Firm* — Artie Pennington; Hunt Pennington Kumar & Dula, PLLC

(57) ABSTRACT

In an RF system comprising a first transceiver (96) and a second transceiver (98), a first transmission, $T_1$, by the first transceiver (96) allows the second transceiver (98) to determine two possible valid angles of arrival, $\pm\theta_1$, of $T_1$. A second transmission, $T_2$, from the second transmitter (98) to the first transmitter (96) containing $\theta_1$ and a bearing, $\alpha_1$, of a known fixed anchor relative to the second transmitter (98), allows the first transmitter (96) to determine two possible valid angles of arrival, $\pm\theta_2$, of $T_2$. From $\theta_1$, $\alpha_1$, $\theta_2$, and a bearing, $\alpha_2$, of the known fixed anchor relative to the first transmitter (96), the first transceiver (96) can determine the valid angle of arrival of $T_2$.

6 Claims, 19 Drawing Sheets

Two Valid Solutions to AOA where Unit was Subjected to "ROLL"

Related U.S. Application Data continuation-in-part of application No. PCT/EP2013/070851, filed on Oct. 7, 2013, which is a continuation-in-part of application No. 13/033,098, filed on Feb. 23, 2011, now Pat. No. 8,436,758, application No. 15/135,383, which is a continuation-in-part of application No. 13/775,282, filed on Feb. 25, 2013, now Pat. No. 8,760,334, which is a continuation-in-part of application No. 12/885,517, filed on Sep. 19, 2010, now Pat. No. 8,437,432.

(60) Provisional application No. 62/150,662, filed on Apr. 21, 2015, provisional application No. 61/316,299, filed on Mar. 22, 2010.

(51) Int. Cl.
*G01S 3/48* (2006.01)
*G01S 3/14* (2006.01)
*H04W 64/00* (2009.01)
*H03M 1/06* (2006.01)

(56) References Cited

U.S. PATENT DOCUMENTS

| | | | | |
|---|---|---|---|---|
| 2003/0054776 A1* | 3/2003 | Hirano | ............... | G01S 3/14 455/107 |
| 2003/0197645 A1* | 10/2003 | Ninomiya | ............... | G01S 3/46 342/464 |
| 2006/0114157 A1* | 6/2006 | Kolanek | ............... | G01S 3/46 342/424 |
| 2009/0260235 A1* | 10/2009 | Rohrbach | ............... | B26B 5/003 30/162 |
| 2009/0262035 A1* | 10/2009 | Gonikberg | ............... | H04B 7/086 343/757 |
| 2014/0028539 A1* | 1/2014 | Newham | ............... | G06F 1/1694 345/156 |
| 2014/0152503 A1* | 6/2014 | Castro | ............... | G01S 3/8036 342/432 |
| 2015/0192656 A1* | 7/2015 | Werner | ............... | G01S 3/46 342/352 |
| 2016/0033616 A1* | 2/2016 | Sen | ............... | H04W 64/00 455/456.5 |

* cited by examiner

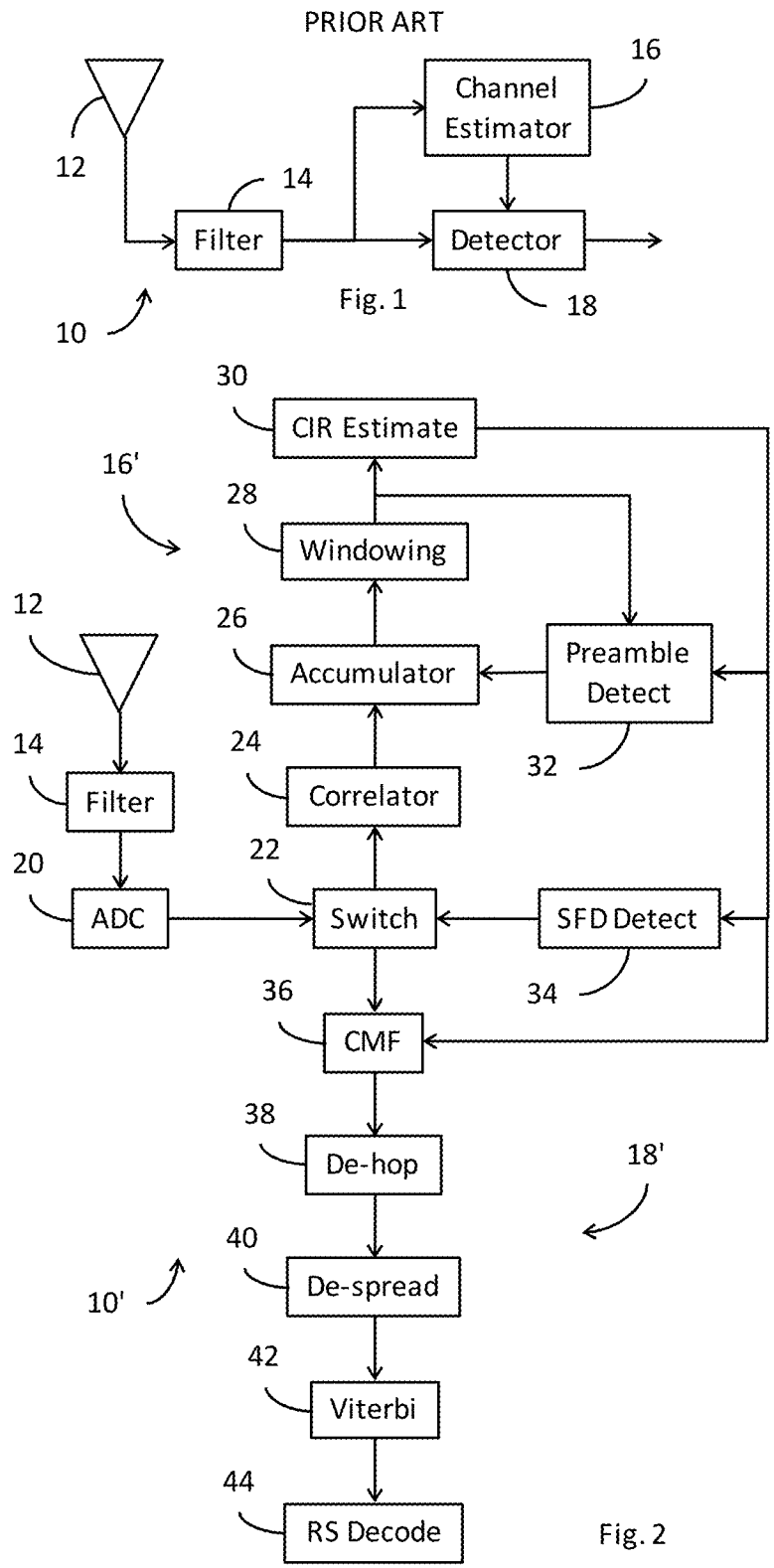

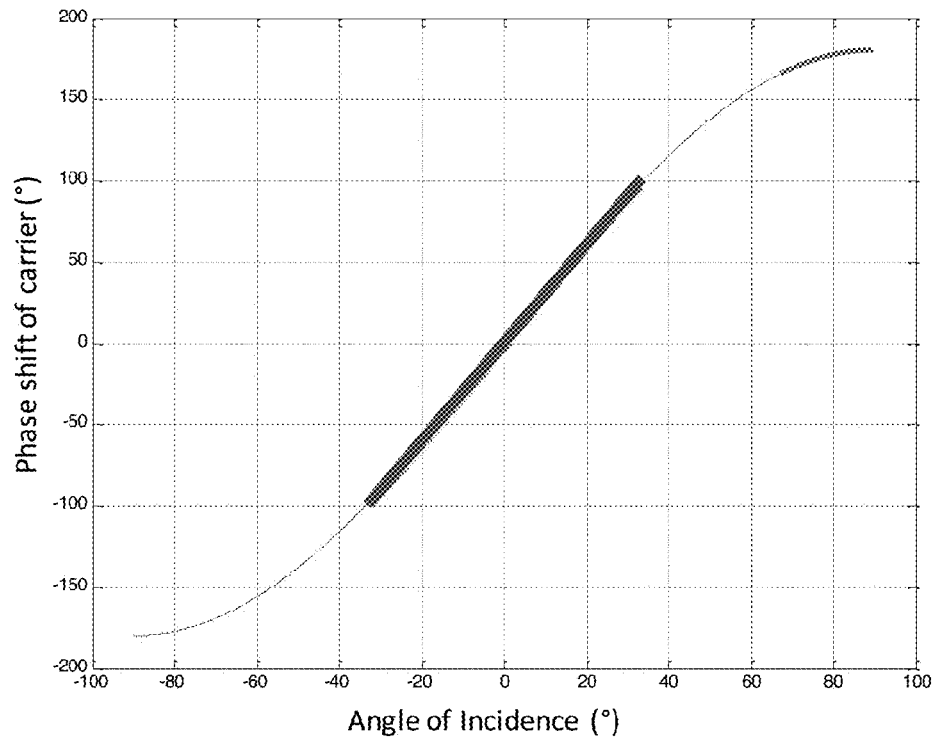
Fig. 17: Angle of Incidence to two ½ wavelength separated antennas
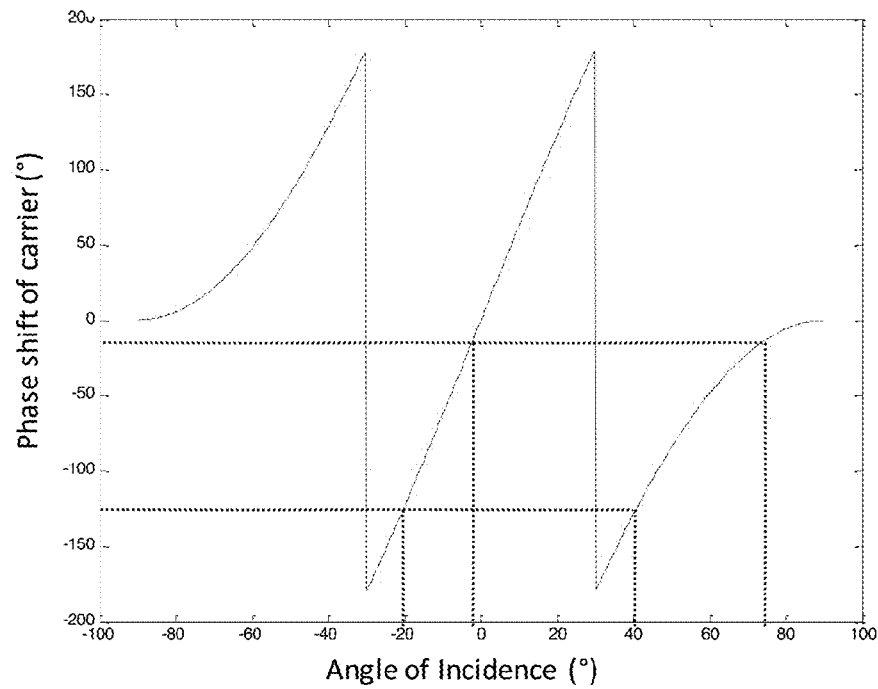
Fig. 18: Angle of Incidence to two 1 wavelength separated antennas

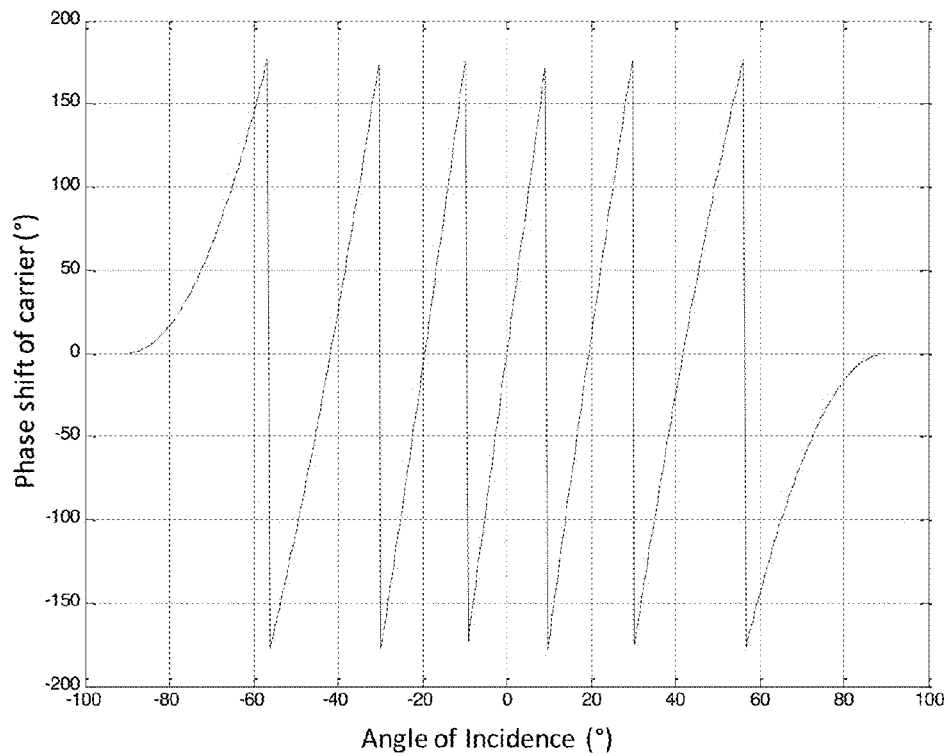
Fig. 19: Angle of Incidence to two antennas separated by 3 wavelengths
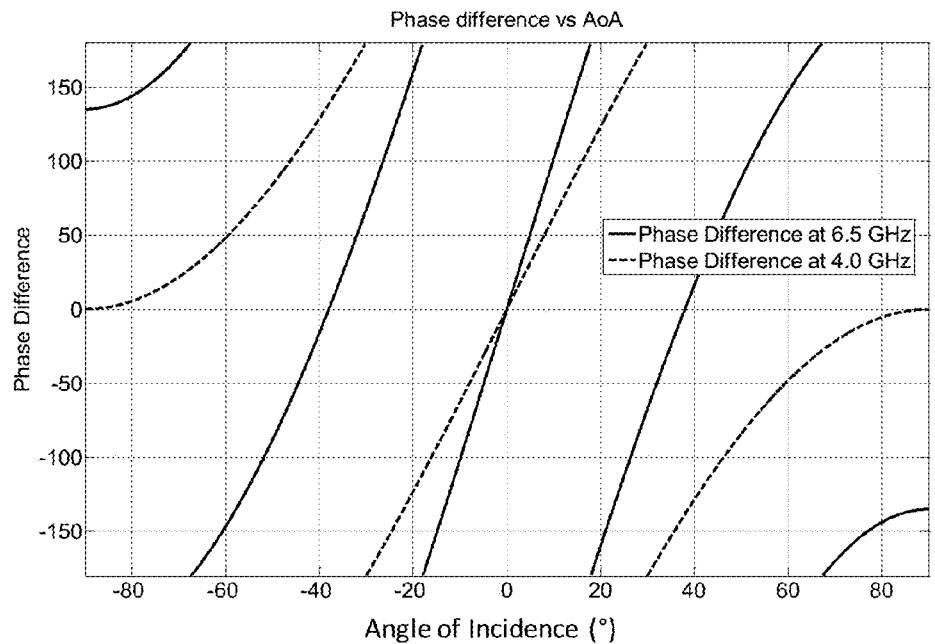
Fig. 20: Angle of Incidence to two antennas separated by 7.5cm for two different center frequencies

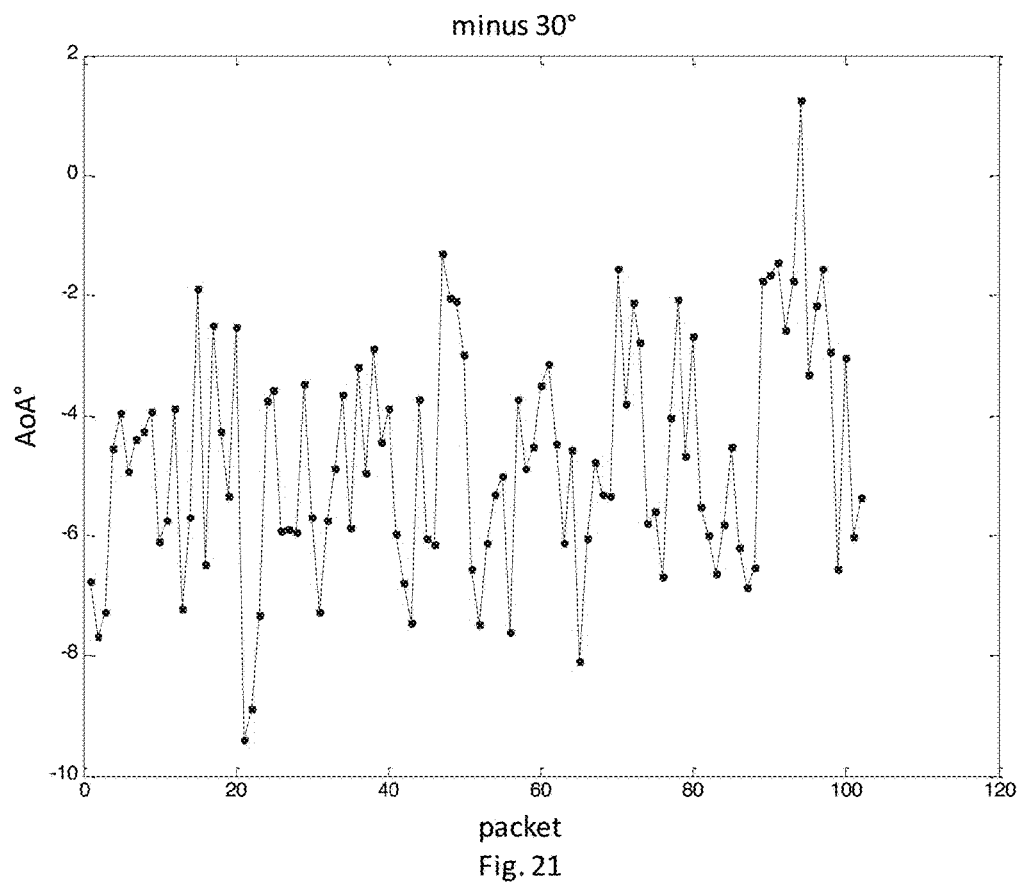
Fig. 21
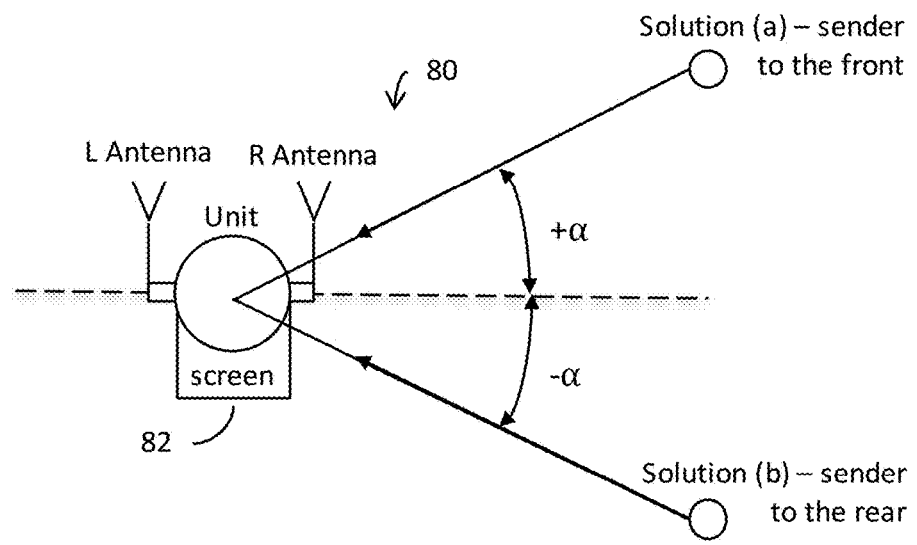
Fig. 22: Two Valid Solutions to AOA

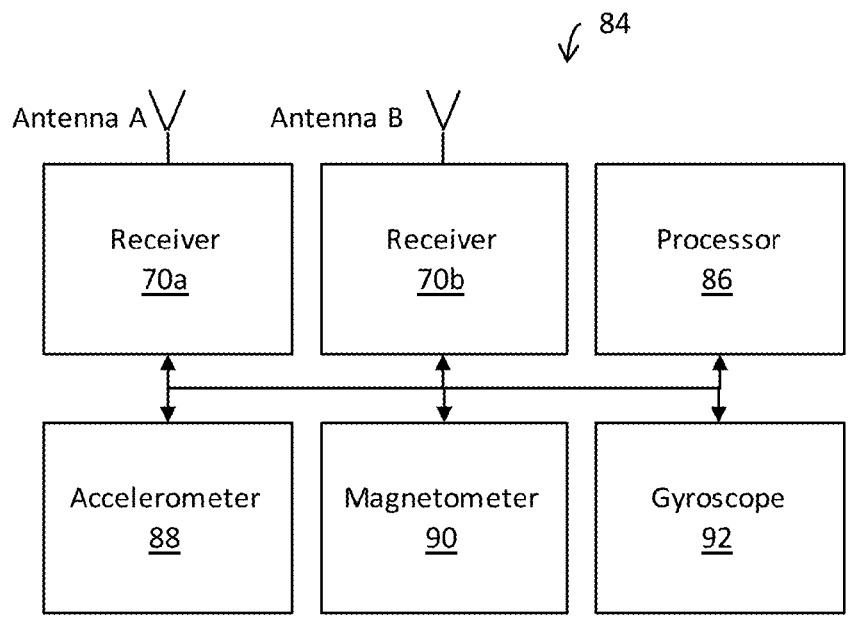
Fig. 23
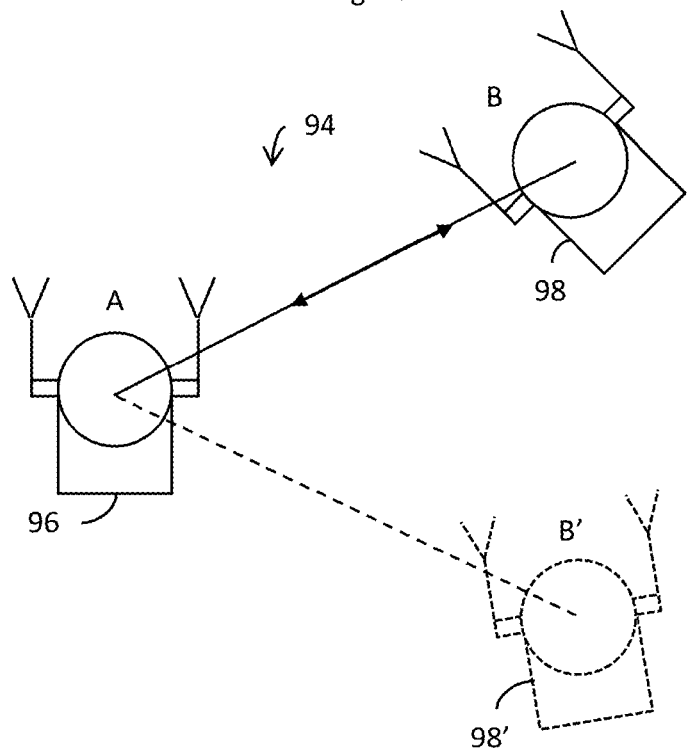
Fig. 24: Two Valid Relative Locations for B (From the Point of View of Unit A)

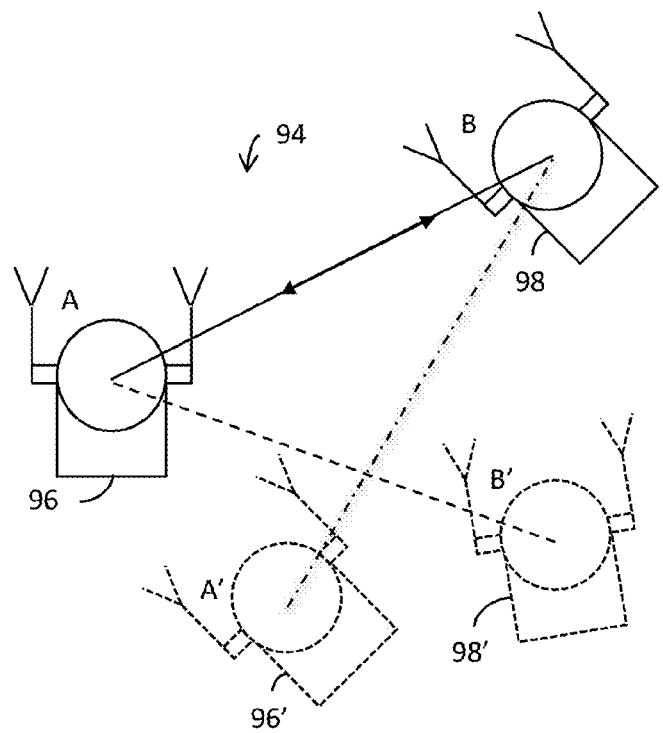
Fig. 25: Valid Relative Locations of Units From Each Other's Point of View
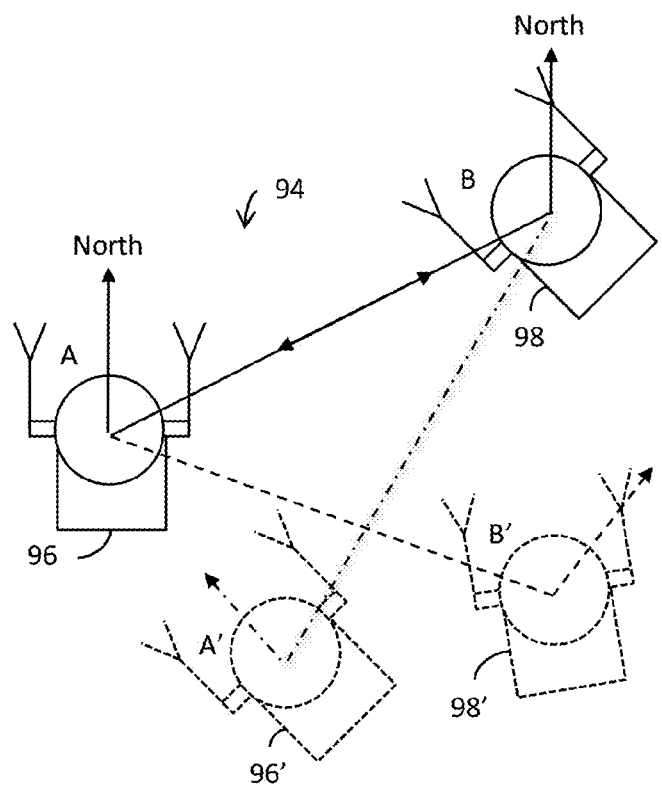
Fig. 26: Using Compass Bearing to Find Single Correct Solution

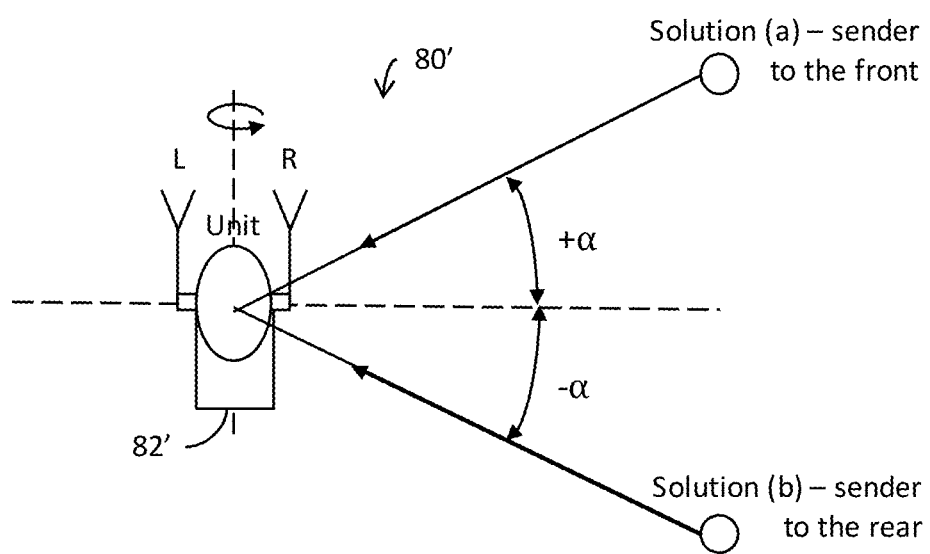
Fig. 27: Two Valid Solutions to AOA where Unit was Subjected to "ROLL"

MEASURING ANGLE OF INCIDENCE IN AN ULTRAWIDEBAND COMMUNICATION SYSTEM

CROSS-REFERENCE TO RELATED APPLICATIONS

This application is a Continuation-In-Part of PCT Application Serial No. PCT/EP2014/060722, filed 23 May 2014 ("First Parent Application").

This application is a Continuation-In-Part of PCT Application Serial No. PCT/EP2013/070851, filed 7 Oct. 2013 ("Second Parent Application").

This application is also a Continuation-In-Part of application Ser. No. 13/775,282, filed 28 Mar. 2013 ("Third Parent Application").

The Second Parent Application is a Continuation-In-Part of application Ser. No. 13/033,098, filed 23 Feb. 2011, now U.S. Pat. No. 8,436,758, issued 7 May 2013 ("First Parent Patent"), which is in turn related to Provisional Application Ser. No. 61/316,299, filed 22 Mar. 2010 ("First Parent Provisional").

The Third Parent Application is also a Continuation-In-Part of application Ser. No. 12/885,517, filed 19 Sep. 2010, now U.S. Pat. No. 8,437,432, issued 7 May 2013 ("Second Parent Patent"), which is in turn also related to the First Parent Provisional.

The subject matter of this Application is also related to the subject matter of PCT Application Serial No. PCT/EP2013/070851, filed 7 Oct. 2013 ("Related Application").

This application is also related to Provisional Application Ser. No. 62/150,662, filed 21 Apr. 2015 ("Second Parent Provisional").

This application claims priority to:
1. The First Parent Application;
2. The Second Parent Application;
3. The Third Parent Application;
4. The First Parent Patent;
5. The Second Parent Patent;
6. The Related Application;
7. The First Parent Provisional; and
8. The Second Parent Provisional;
collectively, "Related References", and hereby claims benefit of the filing dates thereof pursuant to 37 CFR § 1.78(a)(4).

The subject matter of the Related References, each in its entirety, is expressly incorporated herein by reference.

BACKGROUND OF THE INVENTION

1. Field of the Invention

The present invention relates generally to ultra-wideband communication systems, and, in particular, to a receiver for use in an ultra-wideband communication system adapted to determine the angle of arrival of an RF signal.

2. Description of the Related Art

In general, in the descriptions that follow, we will italicize the first occurrence of each special term of art which should be familiar to those skilled in the art of ultra-wideband ("UWB") communication systems. In addition, when we first introduce a term that we believe to be new or that we will use in a context that we believe to be new, we will bold the term and provide the definition that we intend to apply to that term. In addition, throughout this description, we will sometimes use the terms assert and negate when referring to the rendering of a signal, signal flag, status bit, or similar apparatus into its logically true or logically false state, respectively, and the term toggle to indicate the logical inversion of a signal from one logical state to the other. Alternatively, we may refer to the mutually exclusive boolean states as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

In general, in an ultra-wideband ("UWB") communication system, a series of special processing steps are performed by a UWB transmitter to prepare payload data for transmission via a packet-based UWB channel. Upon reception, a corresponding series of reversing steps are performed by a UWB receiver to recover the data payload. Details of both series of processing steps are fully described in IEEE Standards 802.15.4 ("802.15.4") and 802.15.4a ("802.15.4a"), copies of which are submitted herewith and which are expressly incorporated herein in their entirety by reference. As is known, these Standards describe required functions of both the transmit and receive portions of the system, but specify implementation details only of the transmit portion of the system, leaving to implementers the choice of how to implement the receive portion.

One or more of us have developed certain improvements for use in UWB communication systems, which improvements are fully described in the following pending applications or issued patents, all of which are expressly incorporated herein in their entirety:

"A Method and Apparatus for Generating Codewords", U.S. Pat. No. 7,787,544, issued 31 Jul. 2010;

"A Method and Apparatus for Generating Codewords", application Ser. No. 11/309,222, filed 13 Jul. 2006, now abandoned;

"A Method and Apparatus for Transmitting and Receiving Convolutionally Coded Data", U.S. Pat. No. 7,636,397, issued 22 Dec. 2009;

"A Method and Apparatus for Transmitting and Receiving Convolutionally Coded Data", U.S. Pat. No. 8,358,709, issued 22 Jan. 2013; and "Convolution Code for Use in a Communication System", U.S. Pat. No. 8,677,224, issued 18 Mar. 2014.

One particular problem in multi-path, spread-spectrum systems, including UWB, is channel-induced noise present in the received signal. One common technique for significantly reducing the noise level relative to the receive level is to develop, during reception of a training sequence portion of the preamble of each transmitted packet, an estimate of the channel impulse response ("CIR"). Following detection in the received packet of the start-of-frame delimiter ("SFD"), the best CIR estimate is reversed in time and the complex conjugate is developed. This conjugate CIR estimate is thereafter convolved with the payload portion of the packet using a channel matched filter ("CMF"). Shown in FIG. 1 is a UWB receiver 10 adapted to operate in this manner. As is known, the signal received via an antenna 12 is continuously conditioned by a filter 14. During reception of the training sequence, channel estimator 16 develops from the conditioned signal the conjugate CIR estimate. During reception of the payload data, detector 18 employs a CMF (not shown) to convolve the conditioned signal with the conjugate CIR estimate, thereby significantly improving the signal-to-noise ratio ("SNR") and facilitating recovery of the payload data. See, also, "Efficient Back-End Channel Matched Filter (CMF)", U.S. Pat. No. 7,349,461, issued 25 Mar. 2008.

As noted in 802.15.4a, § 5.5.7.1, "UWB devices that have implemented optional ranging support are called ranging-capable devices ("RDEVs")." (Emphasis in original.) For certain applications, such RDEVs are commonly implemented in the form of a relatively compact, autonomous radio-frequency identification ("RFID") tag or the like. Due to the small form factor and limited power supply, it is especially important to select circuit implementations that provide maximum performance at minimum power. Unfortunately, in known implementations of the UWB receiver, improvements in performance usually come at the expense of power. For example, it is known that a rake filter provides good performance in multi-path, spread-spectrum systems such as UWB. See, e.g., slide 21 of "The ParthusCeva Ultra Wideband PHY Proposal", IEEE P802.15 Working Group for Wireless Personal Area Networks, March 2003, a copy of which is submitted wherewith and which is expressly incorporated herein in its entirety by reference. However, known rake filter implementations tend to consume significantly more power than other prior art techniques.

In ranging systems, as in other RF systems, the receiver must coordinate its internal operation to the signal being received from the transmitter. In general, the receiver must achieve synchronism with the received carrier signal, a process referred to as carrier recovery. In addition, the receiver must further achieve synchronism with the information signals superimposed on the carrier, a process referred to as timing recovery. We submit that prior art techniques for performing both carrier recovery and timing recovery in the digital domain are less than optimum.

In the RF system topology shown in FIG. 15, it can be seen that, because of the non-zero angle of incidence, θ, the RF signal will arrive at one antenna before the other. In particular, it can be seen that the path to antenna A is greater than to antenna B by p=d=sin(θ). In order to calculate θ, the angle of incidence, the time difference of arrival could be found. If d is relatively large then this would provide quite an accurate estimate of θ. On the other hand, if d is small the estimate turns out to be highly error prone.

FIG. 16 shows two receivers, 70a and 70b, which are clocked from the same crystal 72. If the same crystal 72 clocks identical phase locked loops ("PLLs"), 74a and 74b, the generated carriers that are supplied to the respective down converter mixers, 76ac-76as and 76bc-76as, will have the same phase. The RF signal will arrive at a slightly later time at antenna A than antenna B, so it will encounter a down converter carrier phase that is different in each of the mixer s 76. If the baseband processors, 78a and 78b, are capable of calculating the complex impulse response of the channel, that impulse response will have a different in-phase ("I") to quadrature ("Q") ratio I/Q which is equal to the phase delay caused by the signal travelling the extra distance, p, before encountering the mixer 70a and being down-converted by the carrier. If the carrier frequency is high, e.g., 4 GHz or 6.5 GHz, then quite small distances, p, will lead to a relatively large carrier phase difference.

$$\sin\theta = \frac{p}{d} \quad \text{[Eq. 1]}$$

$$\lambda = \frac{c}{f} \quad \text{[Eq. 2]}$$

where:
f is the carrier frequency,
c is the speed of light, and
λ is the carrier wavelength.

$$\frac{\alpha}{2\pi} = \frac{p}{\lambda} \quad \text{[Eq. 3]}$$

where:

α is the phase difference between the two carriers for the same point on the incident RF signal.

$$p = \frac{\alpha\lambda}{2\pi} \quad \text{(from Eq. 2 and Eq. 3)} \quad \text{[Eq. 4]}$$

$$\sin\theta = \frac{\alpha\lambda}{2\pi d} \quad \text{(from Eq. 1 and Eq. 4)} \quad \text{[Eq. 5]}$$

$$\theta = \sin^{-1}\frac{\alpha\lambda}{2\pi d} \quad \text{(from Eq. 5)} \quad \text{[Eq. 6]}$$

If, in Eq. 6, d is set to be a half wavelength, then FIG. 17 shows the relationship between α, the phase difference of the impulse responses, and θ, the angle of incidence. Note that the slope of the dark grey section is approximately 3, whereas the slope of the lighter grey section is 0.6, i.e., 5 times worse. If, however, d is set to be a one wavelength, then FIG. 18 shows the relationship between α and θ. Note that, at this separation, there is an ambiguity in that each phase relationship has two possible angles of incidence. As can be seen from FIG. 19, as the antennae are moved further apart, say to 3 wavelengths, the ambiguity only increases.

We submit that the larger separation of one wavelength or more is advantageous for two reasons: first, the slope of the angle of incidence curve versus phase change curve is larger and stays larger for longer, thereby allowing more accurate determination of angle of incidence; and second, as the antennas get closer together, their near fields interfere and their performance starts to affect each other. This is particularly the case when the separation is lower than one wavelength.

We submit that what is needed is an improved method and apparatus for use in the receiver of a UWB communication system to determine angle of incidence. In particular, we submit that such a method and apparatus should provide performance generally comparable to the best prior art techniques but more efficiently than known implementations of such prior art techniques.

BRIEF SUMMARY OF THE INVENTION

In accordance with a preferred embodiment of our invention, we provide a method for use in an RF system comprising a first transceiver and a second transceiver, the method comprising the steps of: [1] in the first transceiver, transmitting a first RF signal, $T_1$; [2] in the second transceiver: [2.1] receiving the first RF signal, $T_1$; [2.2] determining a first angle of arrival, $\theta_1$, of the received first RF signal, wherein $\theta_1$ comprises first and second possible valid angles of arrival, $+\theta_1$ and $-\theta_1$, respectively; [2.3] determining a first bearing, $\alpha_1$, of the second transceiver relative to a predetermined anchor; and [2.4] transmitting via a second RF signal, $T_2$, the first angle of arrival, $\theta_1$, and the first bearing; and [3] in the first transceiver: [3.1] receiving via the second RF signal, $T_2$, the first angle of arrival, $\theta_1$, and the first bearing; [3.2] determining a second angle of arrival, $\theta_2$, of the received second RF signal, wherein $\theta_2$ comprises third and fourth possible valid angles of arrival, $+\theta_2$ and $-\theta_2$, respectively; [3.3] determining a second bearing, $\alpha_2$, of the first transceiver relative to the anchor; and [3.4] determining a valid one of the third and fourth possible valid angles of arrival as a function of: the first angle of arrival, $\theta_1$; the first bearing; the second angle of arrival, $\theta_2$, and the second bearing.

The methods of our invention may be embodied in computer readable code on a suitable computer readable medium such that when a processor executes the computer readable code, the processor executes the respective method.

BRIEF DESCRIPTION OF THE SEVERAL VIEWS OF THE DRAWINGS

Our invention may be more fully understood by a description of certain preferred embodiments in conjunction with the attached drawings in which:

FIG. 1 illustrates, in block diagram form, a prior art receiver adapted for use in a UWB communication system;

FIG. 2 illustrates, in block diagram form, one embodiment of the receiver shown in FIG. 1, but constructed in accordance with our invention;

FIG. 17 illustrates, in waveform, the ratio of the phase shift of the carrier as a function of angle of incidence with respect to two ½ wavelength separated antennas;

FIG. 18 illustrates, in waveform, the ratio of the phase shift of the carrier as a function of angle of incidence with respect to two 1 wavelength separated antennas;

FIG. 19 illustrates, in waveform, the ratio of the phase shift of the carrier as a function of angle of incidence with respect to two antennas separated by 3 wavelengths;

FIG. 20 illustrates, in waveform, the ratio of the phase shift of the carrier as a function of angle of incidence with respect to two antennas separated by 7.5 cm at two different carrier frequencies;

FIG. 21 illustrates, in waveform, the resultant calculated angle of incidence for a 100 packet test;

FIG. 22 illustrates, generally in topographic perspective, an RF communication system, and in particular, illustrates two valid solutions to a measured angle of arrival of a transmitted RF signal;

FIG. 23 illustrates, in block diagram form, an RF communication unit for augmenting the angle of arrival location solution comprising the respective receivers of FIG. 16 together with elements of an inertial measurement unit (IMU) and a processor;

FIG. 24 illustrates, generally in topographic perspective, an RF communication system, and in particular, illustrates two valid relative locations of the source of the transmitted RF signal illustrated in FIG. 22;

FIG. 25 illustrates, generally in topographic perspective, an RF communication system, and in particular, illustrates two valid relative locations of the respective sources of the transmitted RF signal from each other's point of view;

FIG. 26 illustrates, generally in topographic perspective, an RF communication system, and in particular, illustrates using compass bearing to determine the correct source of the two valid relative locations of the respective sources of the transmitted RF signal;

FIG. 27 illustrates, generally in topographic perspective, an RF communication system, and in particular, illustrates similar and indistinguishable angles of incidence of the transmitted RF signal on two antennas spaced apart by a distance of d, where the antennas have undergone a roll in their relative positions.

Figure 3:
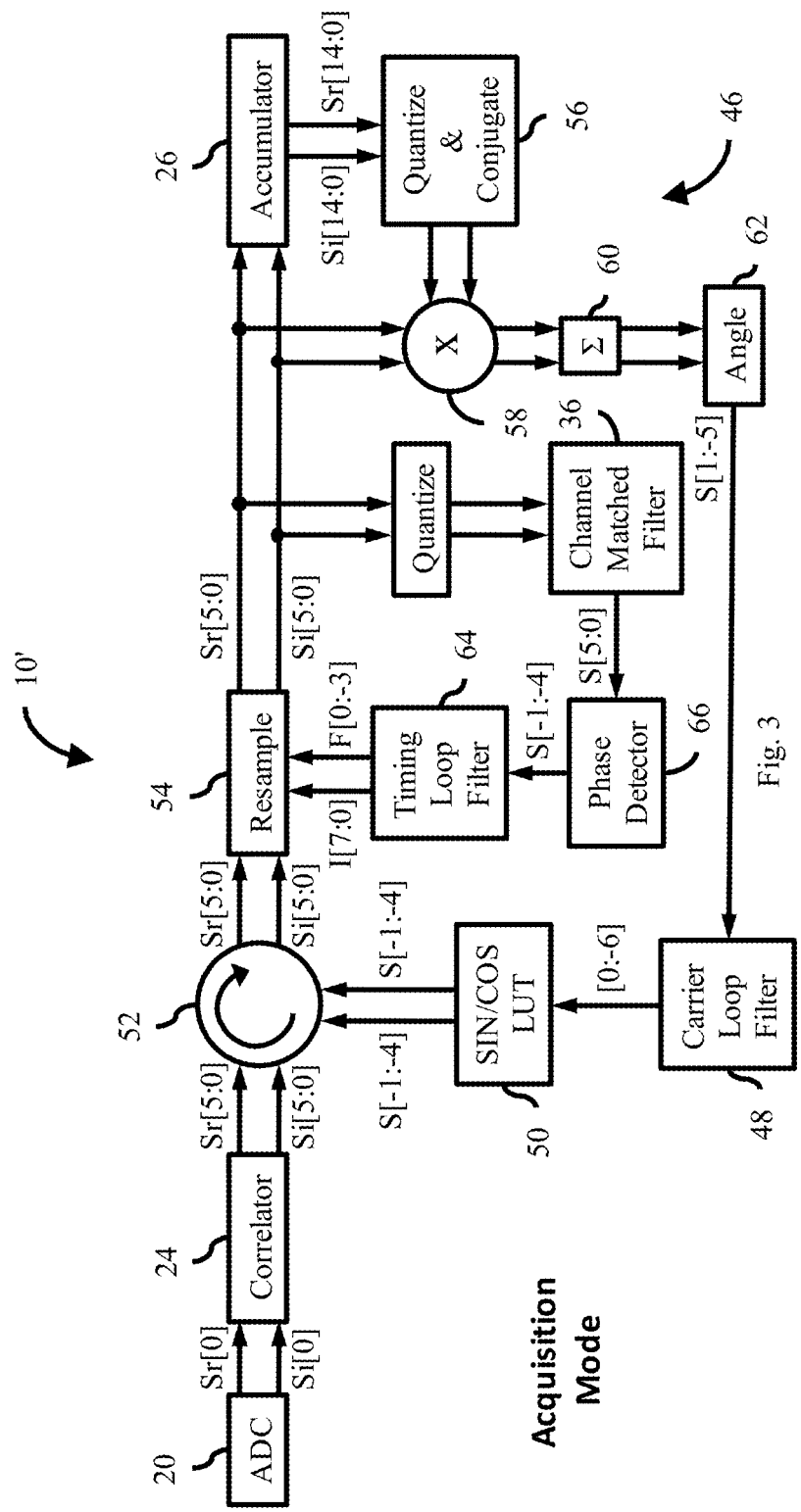
FIG. 3 illustrates, in block diagram form, the portion of the receiver shown in FIG. 2 that performs carrier and timing recovery when the receiver is operating in a carrier acquisition mode.

In the drawings, similar elements will be similarly numbered whenever possible. However, this practice is simply for convenience of reference and to avoid unnecessary proliferation of numbers, and is not intended to imply or suggest that our invention requires identity in either function or structure in the several embodiments.

DETAILED DESCRIPTION OF THE INVENTION

Shown in FIG. 2 is a UWB receiver 10' constructed in accordance with our invention. As in the prior art system shown in FIG. 1, the signal received by antenna 12 is continuously conditioned by filter 14. The conditioned signal is then periodically sampled by an analog-to-digital converter ("ADC") 20 and provided as a continuous series of digital samples. In accordance with a preferred embodiment of our invention, ADC 20 is specially adapted to provide each digital sample in ternary form, i.e., [−1, 0, +1]. In view of the difficulty of currently available standard digital circuit technology efficiently to represent a 3-value variable in the form of a single ternary trit, we anticipate, at least in the near term, such variables will require representation using 2 conventional, binary bits, wherein a first one of the bits represents the numeric component of the variable, i.e., [0, 1], and the second bit represents the sign of the variable, i.e., [+, −]. In this regard, it could be argued that circuit technology has not progressed all that much since Soviet researchers built the first (perhaps only?) documented ternary-based computer systems. See, "*A Visit to Computation Centers in the Soviet Union*," Comm. of the ACM, 1959, pp. 8-20; and "*Soviet Computer Technology—1959*", Comm. of the ACM, 1960, pp. 131-166; copies of which are submitted herewith and which are expressly incorporated herein in their entirety by reference.

In the context of our invention, our trit can be distinguished from a conventional sign+magnitude implementation such as that described in Amoroso83, cited above. Consider the strategy for A/D conversion shown in FIG. 5 of Amoroso83; and, note, especially, that there are three separate and distinct switching thresholds: (i) a sign threshold $[T_0]$; (ii) a positive magnitude threshold $[T_0+\Delta]$; and (iii) a negative magnitude threshold $[T_0-\Delta]$. (See, also, Amoroso83, p. 1119, lines 21-24.) We have discovered that adapting the ADC to use ONLY a positive magnitude threshold $[T_0+\Delta]$ and a negative magnitude threshold $[T_0-\Delta]$ results in only a very small loss in resolution, while improving the performance of an impulse radio UWB receiver. Accordingly, in our preferred embodiment, ADC 20 implements only positive/negative magnitude thresholds $[T_0\pm\Delta]$, thereby simplifying the circuit while simultaneously improving both the conversion time of the ADC 20 and, in general, the performance of the receiver. Such an implementation lends itself naturally to our trit-based scheme, wherein the three defined states indicate, for example, that:

[−1]=> the input is below the negative magnitude threshold $[T_0-\Delta]$;
  [0]=> the input is between the negative magnitude threshold $[T_0-\Delta]$ and the positive magnitude threshold $[T_0+\Delta]$; and
  [+1]=> the input is above the positive magnitude threshold $[T_0+\Delta]$.

In contrast to a conventional sign+magnitude implementation, our trit-based ADC 20 can be readily adapted to operate either at a higher sample rate (improved performance but with more power) or at an equivalent sample rate (substantially equivalent performance but with less complexity, thereby reducing both circuit size and power consumption).

Additional details relating to the construction and operation of our UWB receiver 10' can be found in the Related References. As explained in the Related References, receiver 10' initially operates in an acquisition mode, during which the components are configured to detect an incoming UWB signal transmitted by a remote UWB transmitter (not shown), and to achieve synchronism with that transmission, a process referred to as acquisition. Having achieved acquisition, receiver 10' transitions into a data mode, during which the components are configured to recover data contained within each transmitted packet, a process referred to as demodulation or data recovery.

Shown in FIG. 3 are the components of our receiver 10' that perform carrier and timing recovery when the receiver 10' is operating in the acquisition mode. As explained in our Related References, during operation, ADC 20 develops trit-valued samples of both the in-phase, Sr[5:0], and quadrature, Si[5:0], components of the received signals. In the acquisition mode, these samples are passed to the correlator 24, where they are correlated against the pre-defined preamble code. If a valid preamble is present, the output of the correlator 24 comprises a noisy estimate of the channel impulse response ("CIR"). This noisy CIR estimate is passed, without carrier and timing recovery, to accumulator 26. If a preamble is present, then, as accumulator 26 adds symbols together, the CIR estimate will grow faster than the noise floor. By comparing successive accumulated groups of CIR estimates, the acquisition control logic (described in our Related References) can determine if there is a valid preamble present.

Once a preamble has been identified, the carrier recovery logic is activated to correct carrier error in the received data. Logic 46 computes an instantaneous phase error estimate of the received UWB signal by performing an inverse tangent operation on the in-phase, i.e., real, and quadrature, i.e., imaginary, components of the signal phasor. A carrier loop filter 48 uses this estimate to compute a correction angle to be applied to the current input to the accumulator 26. This correction angle is developed as a carrier recovery phase signal (7-bits unsigned) wherein the output range is 0.0 to almost 2.0, and where the value 2.0 is equivalent to one revolution. A look-up-table ("LUT") 50 converts the correction angle to a corresponding pair of cosine (5-bits, including a sign bit) and sine (5-bits, including a sign bit) values. Using these sine and cosine values, a rotator 52 rotates the correlated samples by implementing a complex multiplication for each sample, followed by rounding to return the output real and imaginary samples to 7-bit signed values. The rotated correlated samples are then resampled by resample 54 for use by the accumulator 26.

There is a finite probability that a detected preamble is not valid. Accordingly, our accumulator 26 spends some time assessing the quality of the incoming signal. If the quality is found to be poor, the preamble is rejected and accumulator 26 resumes searching for a preamble. If the quality is found to be sufficiently high, the next task is to search for a start-of-frame-delimiter ("SFD") by comparing the incoming correlator samples against the accumulated CIR estimate. This is performed for each symbol, and the result quantised to a 2-bit signed value. This 2-bit signed value should be +1 throughout the preamble, but then, once the SFD pattern is received, it should follow the pattern of the SFD. For example, for a short SFD, this would be [0, +1, 0, −1, +1, 0, 0, −1]. A corresponding search pattern is used to find this sequence on the 2-bit quantised values. This allows the SFD pattern to be identified, and the time to transition to data mode determined.

Figure 4:
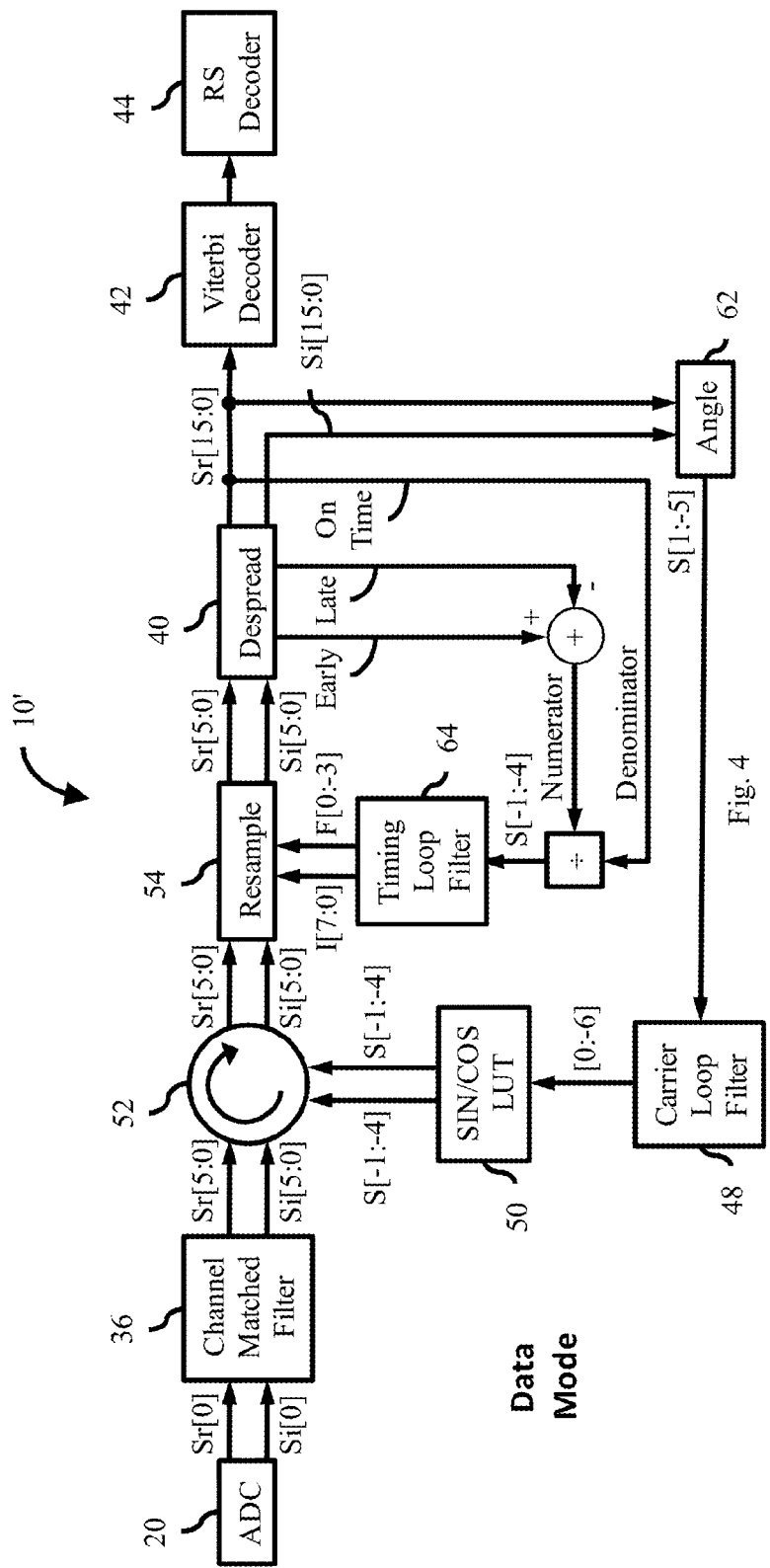
FIG. 4 illustrates, in block diagram form, the portion of the receiver shown in FIG. 2 that performs carrier and timing recovery when the receiver is operating in a data recovery mode.

Shown in FIG. 4 are the components of our receiver 10' that perform carrier and timing recovery when the receiver 10' is operating in the data mode. No later than the end of the acquisition mode, the CIR estimate developed by accumulator 26 is loaded into the channel-matched-filter ("CMF") 36. Once receiver 10' switches to data mode, the ADC 20 samples are passed to the CMF 36, which gathers the energy of the received UWB pulses together, thereby compensating for the smearing effect of the multi path channel. The resulting output pulses are passed through the timing and carrier recovery loops to compensate for any offset, and then into despreader 40. Despreader 40 applies the same pseudo-random noise ("PN") spreading sequence used in the transmitter (not shown) to generate the burst, and integrates over the burst. As despreader 40 does not know if a logic_1 or a logic_0 is being transmitted, it despreads at both possible locations to produce two estimates. These two estimates provide the soft input to the Viterbi decoder 42, which produces a maximum likelihood estimate of the bit sequence. The first section of the packet to be demodulated is the PHY header ("PHR"), which contains information about the data rate and the number of octets transmitted. As is known, this is protected by a single-error-correct-double-error detect ("SECDED") code. Once the PHR is decoded, the relevant information is extracted to allow the demodulation, i.e., recovery, of the data payload. The remaining payload is then passed through the Viterbi decoder 42 to Reed-Solomon ("RS") decoder 44 to correct any errors or report errors that cannot be corrected.

As shown in FIG. 3, in the acquisition mode, the instantaneous phase error estimate is derived from the output of correlator 24 as follows:

1. The accumulated samples, Sr[14:0] and Sr[14:0], are quantized and the conjugate calculated in logic block 56;
2. The complex correlated samples from resampler 54 are multiplied by the conjugate by multiplier 58; and
3. The products are summed by summer 60 to produce the complex instantaneous phase error estimate phasor, comprising Sr[15:0] and Si[15:0].

As shown in FIG. 4, in the data mode, the complex instantaneous phase error estimate phasor simply comprises the outputs of despreader 40, comprising Sr[15:0] and Si[15:0].

Figure 5:
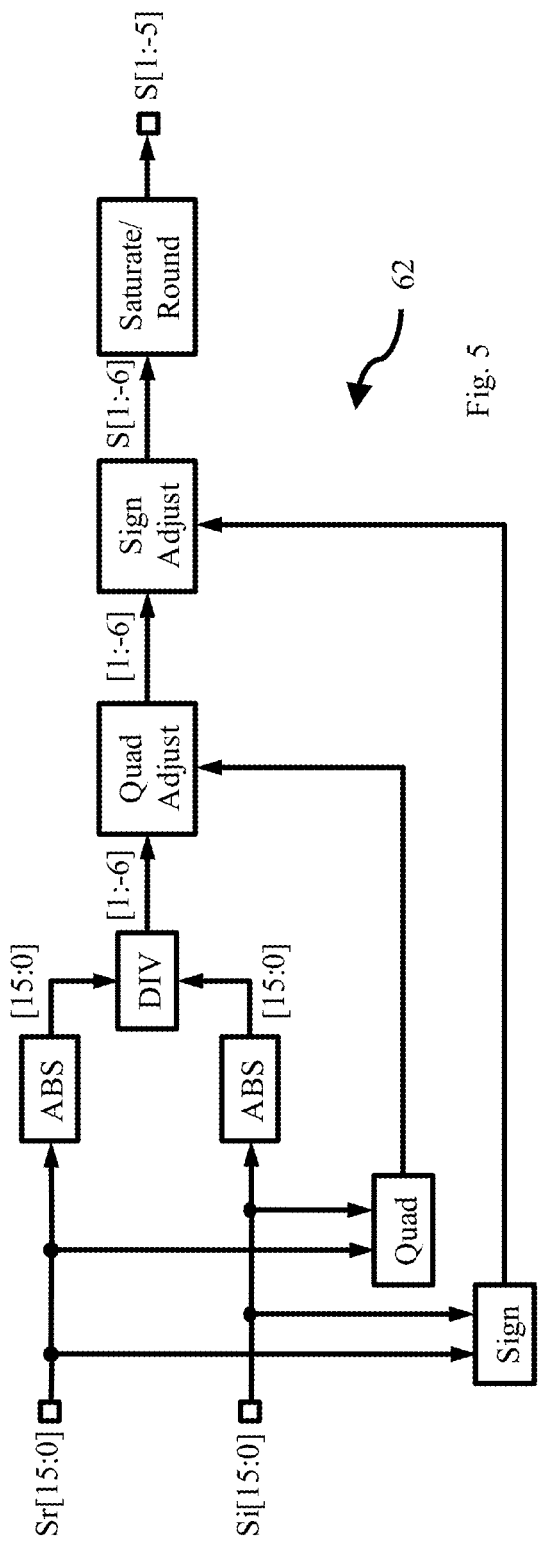
FIG. 5 illustrates, in block diagram form, the error angle calculation block shown, e.g., in FIG. 3.

The instantaneous phase error estimate phasor is then converted to a corresponding angle by logic block 62. As shown in FIG. 5, the complex error estimate phasor consists of two 17-bit signed numbers. The angle of the phasor is determined by dividing the imaginary component of the phasor, Si[15:0], by the real component, Sr[15:0]. Ideally the resulting quotient would then be passed to an inverse tangent function to compute the exact angle; however, for the purposes of our carrier recovery algorithm, we have determined that the quotient per se is a sufficient approximation to the angle. To simplify the division computation, we first identify the sign and quadrant of the phasor, and then compute the absolute value of the real and imaginary parts. These absolute values are then passed to the division computation, and the resulting angle is post-processed to map it into the appropriate quadrant/sign. The remapped estimate is then subjected to rounding and saturation to produce the signed 7-bit instantaneous phase error estimate, S[0:−5], in radians.

Figure 6:
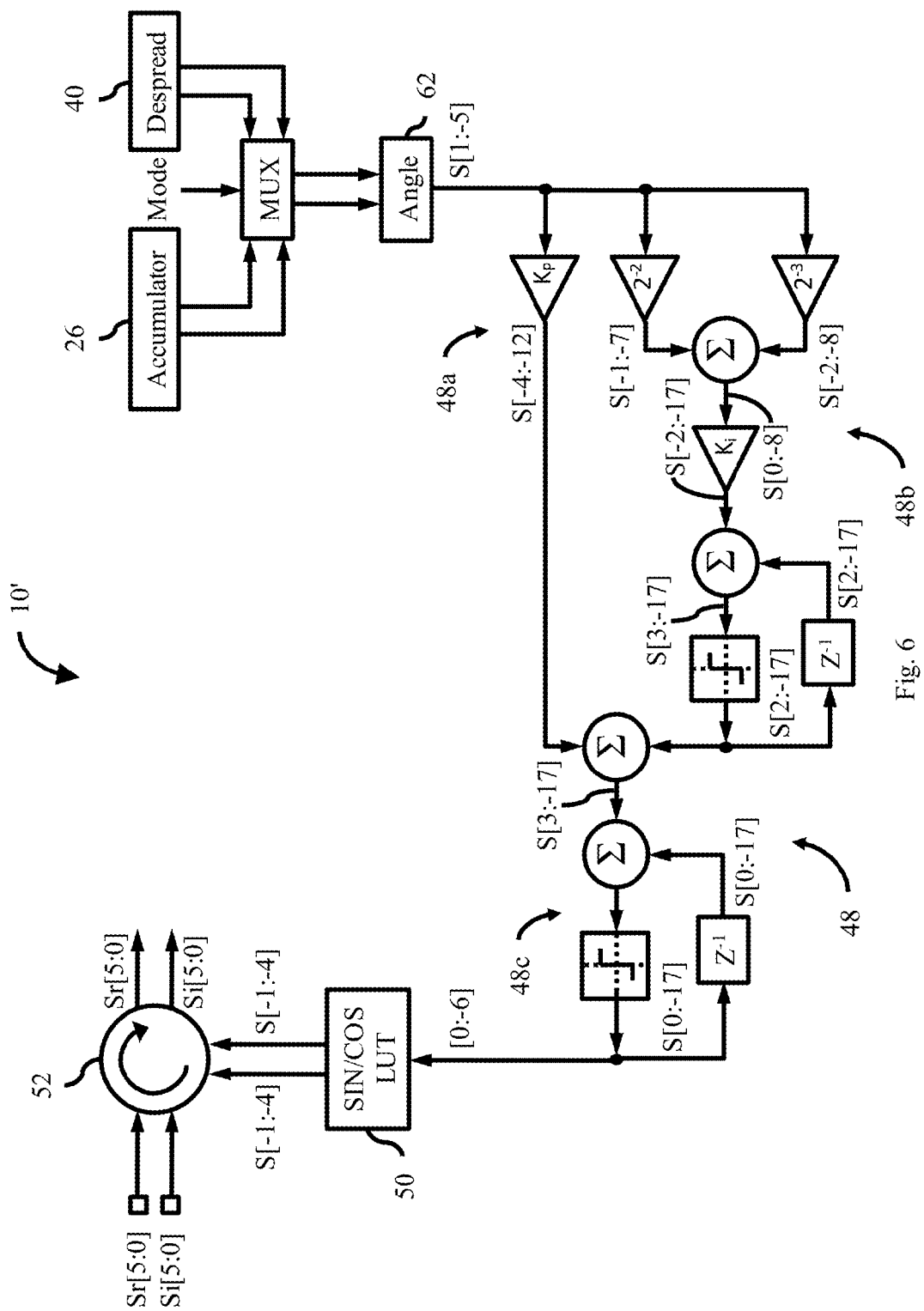
FIG. 6 illustrates, in relative isolation, those components of the receiver shown in FIG. 3 adapted to perform carrier recovery.

The structure of carrier loop filter 48 can be seen in greater detail in FIG. 6. As shown, the instantaneous phase error estimate is passed through a proportional gain arm 48a and an integral gain arm 48b. The gains, $K_p$ and $K_i$, are controlled by a gear-shifting algorithm to allow the loop to lock quickly, and then to rapidly tighten to a narrow bandwidth to minimise the impact of noise on the carrier recovery algorithm. The gear shifting is controlled by a counter (e.g., see, FIG. 7) that counts the number of phase error estimates supplied to the loop, and selects a respective scaling factor. (The default gear shifting table is described below.) The filtered phase error estimate is accumulated in a carrier phase accumulator 48c to track the over-all phase error, and to adjust the instantaneous phase error to track frequency errors of up to +/−40 ppm.

When receiver 10' transitions from acquisition to data mode, the rate of update of the carrier recovery loop 48 will change (from the preamble symbol interval to the data symbol interval); this requires that the integral term in the carrier loop filter 48b be scaled to compensate for this change as follows:

TABLE 1

Carrier Loop Filter Scaling Table

| Preamble Symbol | Data Symbol | Scale Factor |
|---|---|---|
| 992 | 1024 | 33/32 |
| 1016 | 10124 | 129/128 |
| 992 | 8192 | 8*(33/32) |
| 1016 | 8192 | 8*(129/128) |

In data mode, we have determined that the application of the phase rotation in a single "lump" at the end of each symbol has a negative impact on the performance of the receiver. For the 6.8 Mb/s case, the phase is applied at the end of a group of 8 symbols, so the symbols towards the end of this group suffer from increased phase error as compared to those at the start. Similarly for the 850 kb/s case, the symbols representing a logic_1 will have a higher phase error than those representing a logic_0. Worst of all is the 110 kb/s case, which will suffer from a phase error increase throughout a symbol and, depending on the hop position of the symbol, will have an effectively random phase error to start with if the carrier offset is high enough. To compensate for this, our preferred embodiment will smooth the phase rotation during the data demodulation phase.

Figure 7:
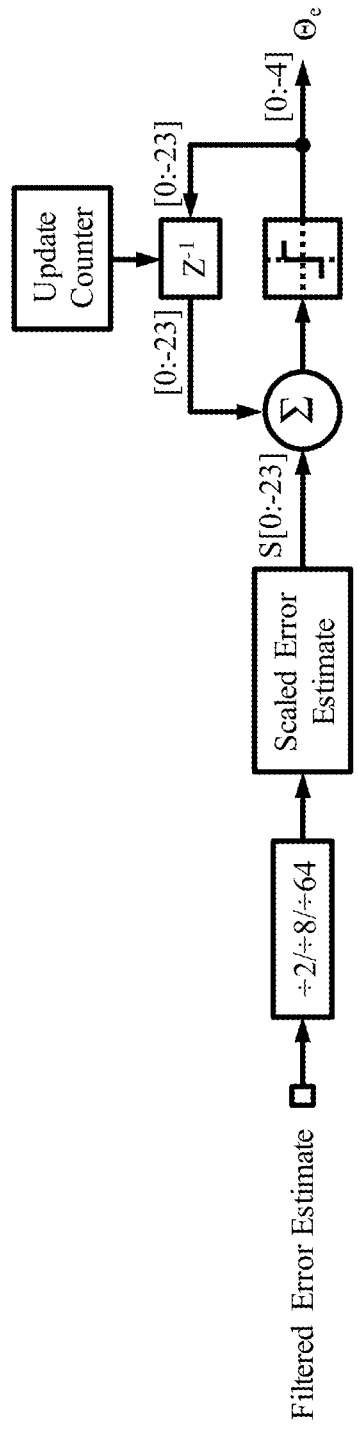
FIG. 7 illustrates, in block diagram form, a programmable scaler adapted for use with our carrier loop filter shown in FIG. 6.
Figure 8:
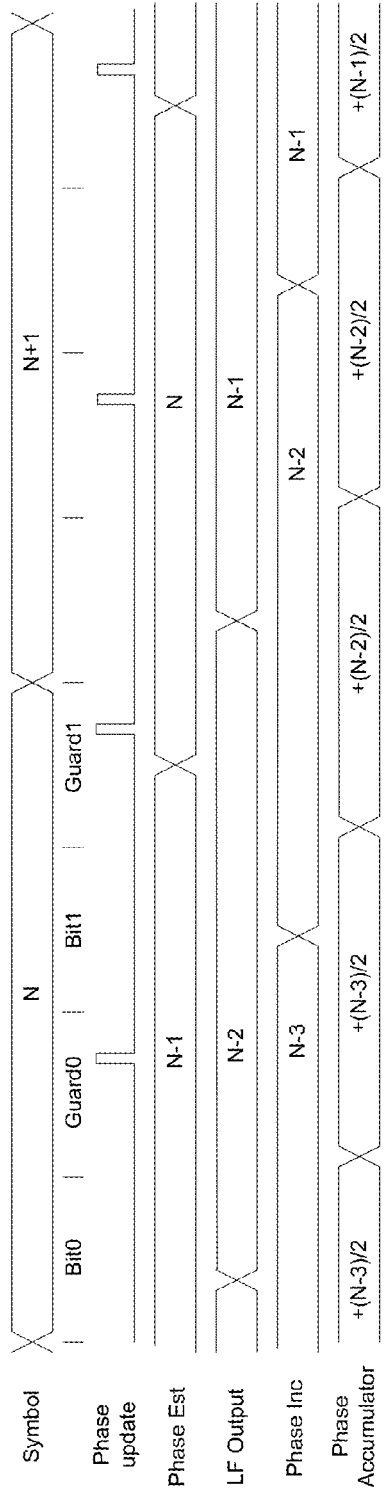
FIG. 8 illustrates, in signal wave form, our approach to scale the filtered phase error estimate and apply it to the accumulator more often than once per symbol in the case of 850 kb/s.
Figure 9:
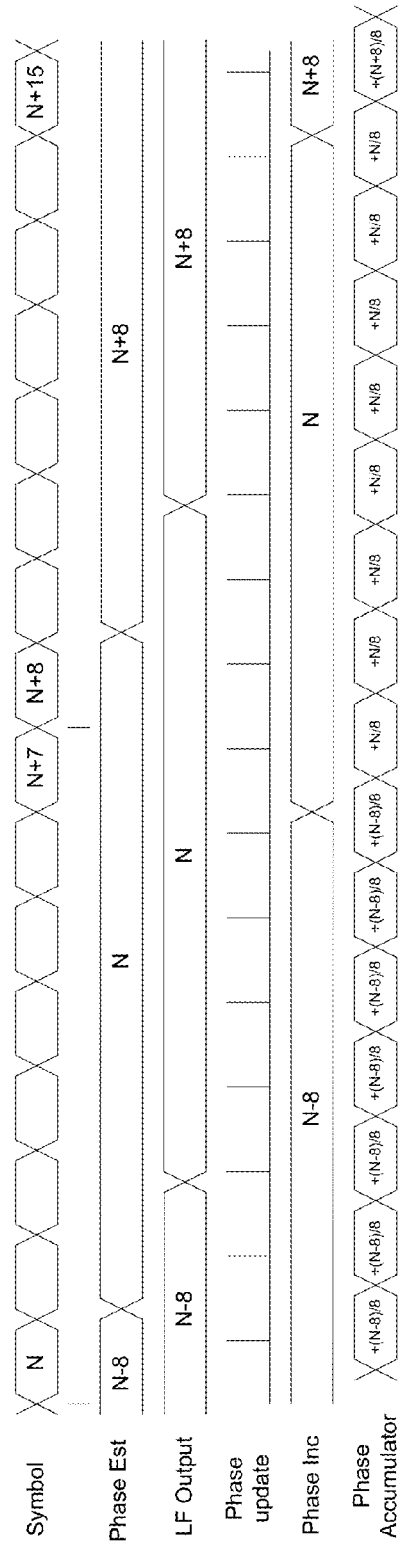
FIG. 9 illustrates, in signal wave form, our approach to scale the filtered phase error estimate and apply it to the accumulator more often than once per symbol in the case of 6.8 Mb/s.
Figure 10:
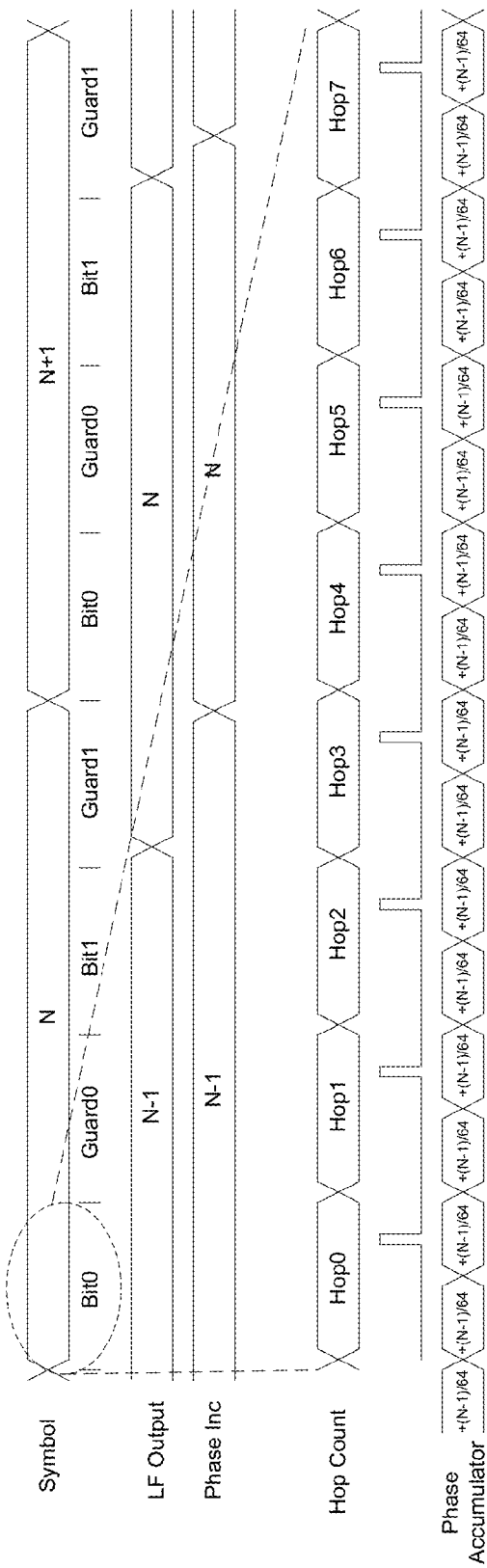
FIG. 10 illustrates, in signal wave form, our approach to scale the filtered phase error estimate and apply it to the accumulator more often than once per symbol in the case of 110 kb/s.
Figure 11:
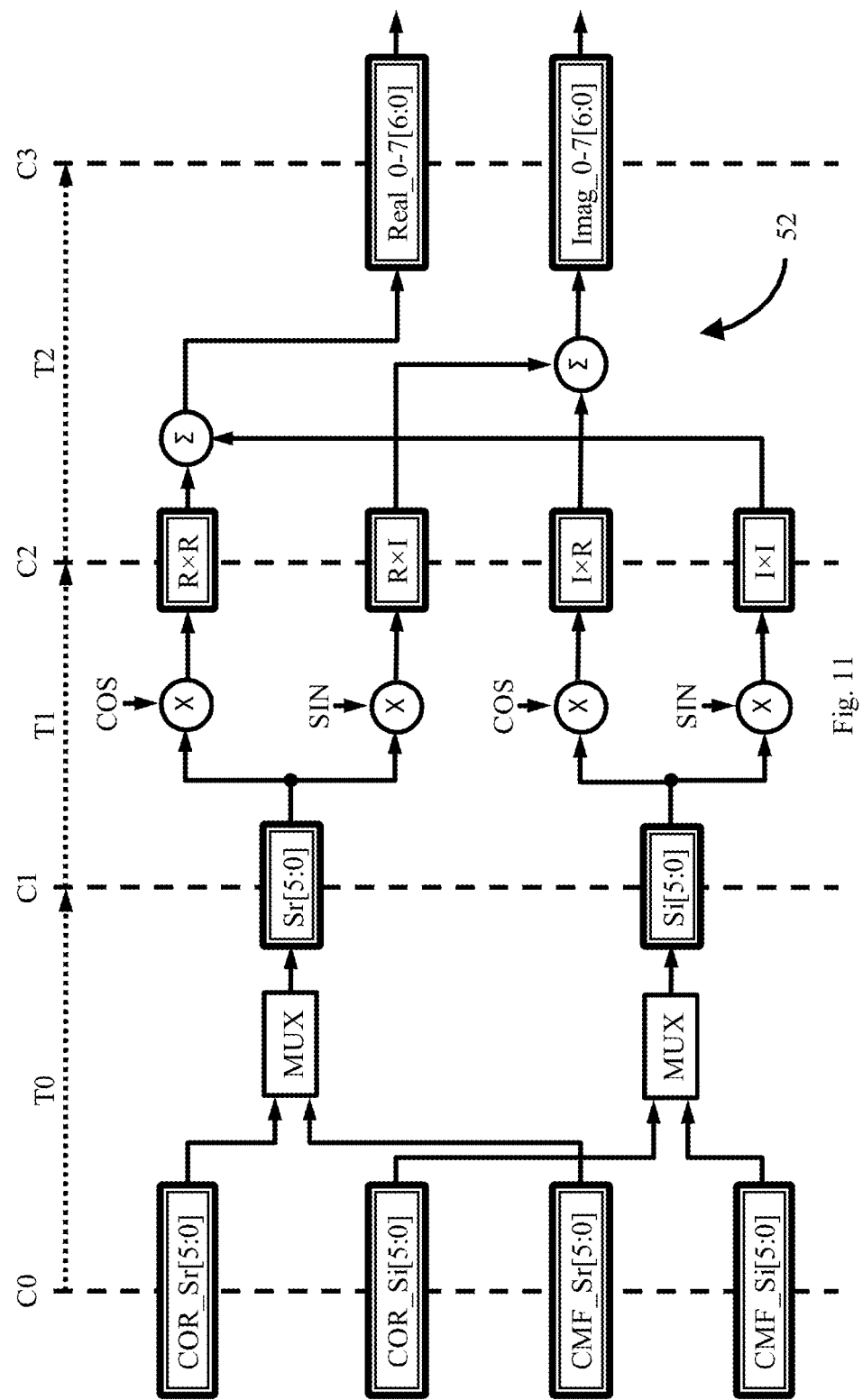
FIG. 11 illustrates, in block diagram form, a rotator adapted for use with our carrier loop filter shown in FIG. 6.

As shown in FIG. 7, our approach is to scale the filtered phase error estimate and apply it to the accumulator more often than once per symbol. In the case of 850 kb/s, the filtered phase error will be scaled down by a factor of 2 and accumulated twice (i.e., every 64 clock cycles) during the phase update interval. (See, e.g., FIG. 8.) This means that instead of the phase adjustment being applied in a single lump at the end of the interval, it will be distributed over the course of the symbol, thereby allowing the despread data towards the end of the interval to have a more accurate phase correction. In the case of 6.8 Mb/s, the filtered phase error will be scaled down by a factor of 8 and accumulated 8 times (i.e., every 16 clock cycles) during the phase update interval. (See, e.g., FIG. 9.) In the case of the 110 kb/s, the filtered phase error estimate will be scaled down by a factor of 64 and accumulated 64 times (i.e., every 16 clock cycles) during the phase update interval. (See, e.g., FIG. 10.) The despreader 40 will control when the phase rotation is applied, so that the phase rotation is updated just before it is needed for demodulation of a burst.

In our preferred embodiment, we implement a register-based field programmable gear shifting mechanism. Ten gears may be configured; one is reserved for demodulation mode, allowing nine acquisition gears. Each gear is assigned: a count at which it is activated; a $K_p$ value; and a $K_i$ value. Writing a value of logic_0 as the count for a gear other than the first gear terminates the gear shifting table; whilst still switching to the demodulation gear when the acquisition phase is over. Note that two sets of demodulation coefficients must be specified, one for the 110 Kbps data rate case, and one for the 850K and 6.81 Mbps cases. The default values for each of the available programmable registers are given in the following table:

TABLE 2

Carrier Recovery Loop Gear Shifting Table

| Register | Count | $K_i$ | $K_p$ |
|---|---|---|---|
| CR0 | 0 | 0x8: $3*2^{-6}$ | 0x7: $2^{-3}$ |
| CR1 | 12 | 0x7: $3*2^{-7}$ | 0x7: $2^{-3}$ |
| CR2 | 20 | 0x6: $3*2^{-8}$ | 0x6: $2^{-4}$ |
| CR3 | 32 | 0x6: $3*2^{-8}$ | 0x6: $2^{-4}$ |
| CR4 | 40 | 0x5: $3*2^{-9}$ | 0x5: $2^{-5}$ |
| CR5 | 64 | 0x4: $3*2^{-10}$ | 0x5: $2^{-5}$ |
| CR6 | 128 | 0x3: $3*2^{-11}$ | 0x4: $2^{-6}$ |
| CR7 | 192 | 0x2: $3*2^{-12}$ | 0x4: $2^{-6}$ |
| CR8 | 256 | 0x1: $3*2^{-13}$ | 0x3: $2^{-7}$ |
| CR9 | 1023 | 0x0: $3*2^{-14}$ | 0x3: $2^{-7}$ |

The K factors are coded as follows:

| | Minimum | Maximum | Decode |
|---|---|---|---|
| Count | 1 | 1023 | Sample count on which to apply gearing values |
| Ki | 0x0 | 0xA | 0x0 = $2^{-11} \times (2^{-2} + 2^{-3})$<br>0x1 = $2^{-10} \times (2^{-2} + 2^{-3})$<br>0x2 = $2^{-9} \times (2^{-2} + 2^{-3})$<br>0x3 = $2^{-8} \times (2^{-2} + 2^{-3})$<br>0x4 = $2^{-7} \times (2^{-2} + 2^{-3})$<br>0x5 = $2^{-6} \times (2^{-2} + 2^{-3})$<br>0x6 = $2^{-5} \times (2^{-2} + 2^{-3})$<br>0x7 = $2^{-4} \times (2^{-2} + 2^{-3})$<br>0x8 = $2^{-3} \times (2^{-2} + 2^{-3})$<br>0x9 = $2^{-2} \times (2^{-2} + 2^{-3})$<br>0xA = $2^{-1} \times (2^{-2} + 2^{-3})$<br>0xB – 0xF - invalid |
| Kp | 0x0 | 0x7 | 0x0 = 00<br>0x1 = $2^{-9}$<br>0x2 = $2^{-8}$<br>0x3 = $2^{-7}$<br>0x4 = $2^{-6}$<br>0x5 = $2^{-5}$<br>0x6 = $2^{-4}$<br>0x7 = $2^{-3}$ |

Under very noisy conditions, the carrier recovery loop may fail to lock correctly. This will result in a preamble rejection in the accumulator 26 (if this mode is enabled), effectively giving the carrier recovery loop another shot. The timing recovery loop can still fail to lock, however, and it does not get another chance since by the time this has an effect the preamble will likely be confirmed.

Preferably, LUT 50 updates the SIN (5-bits signed) and COS (5-bits signed) values under the control of accumulator 26 during acquisition mode and by despreader 40 during data mode. This is in order to prevent phase changes being applied at times when the data is important to the algorithm in question, so it must be applied outside of the impulse response during acquisition, and outside of a burst position during demodulation.

Figure 12:
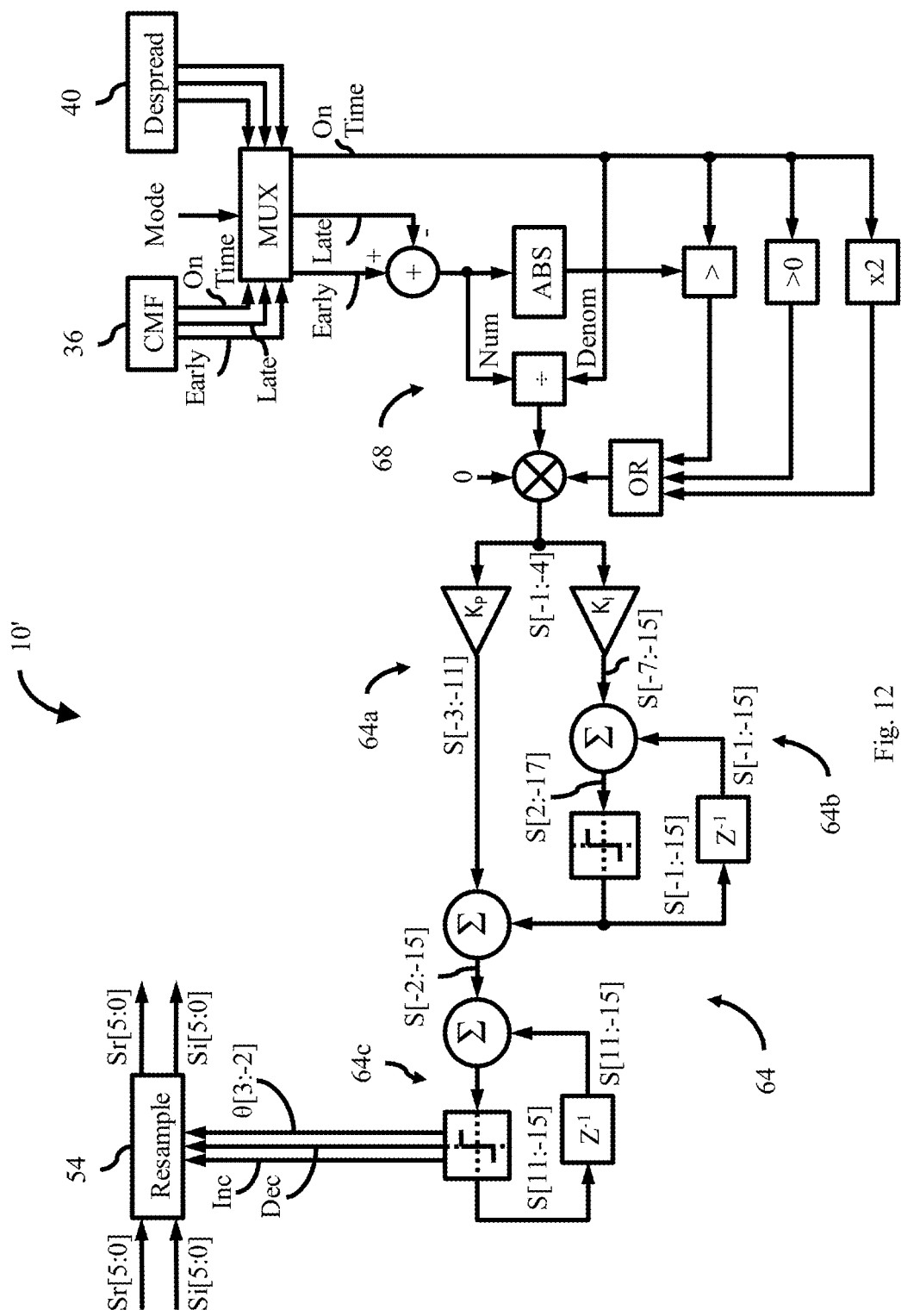
FIG. 12 illustrates, in relative isolation, those components of the receiver shown in FIG. 4 adapted to perform timing recovery.

Rotator 52 takes the SIN and COS values from LUT 50 and applies them to the incoming data vectors. This rotation is applied to the correlator 24 outputs during acquisition, and to the CMF 36 outputs during data demodulation. As shown in FIG. 12, the first stage, T0, selects between the registered outputs of correlator 24 and CMF 36 depending on the mode. The second stage, T1, performs the 4 multiplications that are required for a full complex multiplication, these multiplication results are then registered. The third stage, T2, sums the real components and the imaginary components of the complex multiplication, applies rounding to return the rotated samples to a precision of 7-bits (signed) and registers them for the output. Therefore the total latency of the rotator 52 is four clock cycles, C0-C3.

Our timing estimation is based on an early-late gating algorithm. As illustrated in FIG. 3 and FIG. 4, the source of data for this algorithm is dependent upon the phase of reception: during acquisition mode, the necessary timing information is derived from the output of CMF 36; and, during data mode, the despreader 40 provides the necessary timing information. In both cases the information is used to generate an instantaneous timing estimate. This estimate is conditioned and passed into a timing loop filter 64 typical of a second order loop. The timing loop filter 64 output provides sample-level timing adjustment information to the resampler 54 during acquisition mode, and clock cycle level adjustments to the accumulator 26 and despreader 40 during data mode.

As shown in FIG. 12, during acquisition mode, the timing estimate is derived from early/on-time/late samples from the output of the CMF 36. Once the preamble has been detected, the accumulator 26 will start writing CIR coefficients to the CMF 36. As noted before, the output of the correlator 24 provides an instantaneous noisy estimate of the CIR. As the timing offset error accumulates in the accumulator 26, the position of this estimate within the symbol will slowly vary. Quantizing the correlator 24 output and feeding it into the CMF 36 result in a correlation peak at the output of the CMF 36 corresponding to the position of the noisy impulse response estimate in the correlator 24 output symbol. In our preferred embodiment, the functions of quantisation of the correlator 24 output and routing to CMF 36 are performed by resampler 54.

As the timing of the incoming signal changes, the position of this correlation peak in the output of the CMF 36 will move. In general, this movement will be gradual relative to one preamble symbol duration and therefore can be tracked. The accumulator 26 provides a timing flag to indicate when the correlation peak is expected at the output of the CMF 36. This flag is based on the latency of the accumulator 26 and CMF 36 relative to the estimated impulse response location. Initially, this will be very accurate as the timing phase error will be negligible, but, as the phase error accumulates, the peak will move, thus providing the desired timing information. The correlation peak is ideally the on-time sample, with the early and late samples being the one immediately preceding and following the on-time sample respectively. These three samples are passed to a phase detector 66 (see, FIG. 3) that computes an instantaneous timing phase error for the timing loop filter 64.

During demodulation, the despreader 40 provides dedicated early and late outputs in addition to the normal on-time output used as part of the demodulation process. These outputs are provided for both possible burst positions (depending on if the data is a logic_0 or a logic_1); thus, an early instantaneous decision is needed in order to identify which of the two sets of early/on-time/late samples to use in computing the instantaneous timing phase error estimate. Once this decision is made, the computation is performed and the error passed to the the timing loop filter 64.

The phase error estimation is based on the previously described early/on-time/late samples. A difference computation is performed by computational block 68. The difference between the early and late values is computed and checked against the on-time (on-time should be greater). If the on-time value is negative or zero (after conditioning), then the data is unreliable and the phase estimate zeroed. The difference is divided by twice the peak and the result checked to be less than 0.75 (otherwise it is considered unreliable) and passed out as the instantaneous timing error estimate in the format S[−1:−4]. This instantaneous timing error estimate is then passed on to the timing loop filter 64.

As shown in FIG. 12, timing loop filter 64 comprises a proportional gain arm 64a and an integral gain arm 64b. The gains, Kp and Ki are controlled by a gear-shifting algorithm to allow the loop to lock quickly and then rapidly to tighten to a narrow bandwidth to minimise the impact of noise on the timing recovery algorithm. The gear shifting is controlled by a counter (e.g., see, FIG. 7) that counts the number of timing error estimates supplied to the loop and operates, in one example, as follows:

TABLE 3

Timing Estimation Loop Gear Shifting Table

| Number of samples | $K_p$ | $K_i$ |
|---|---|---|
| 0-5 | 0 | 0 |
| 5-28 | $31/(2^{-7})$ | 0 |
| 28-80 | $31/(2^{-7})$ | $20/(2^{-11})$ |
| 80-120 | $15/(2^{-7})$ | $5/(2^{-11})$ |
| 120 onwards | $11/(2^{-7})$ | $1/(2^{-11})$ |

Figure 13:
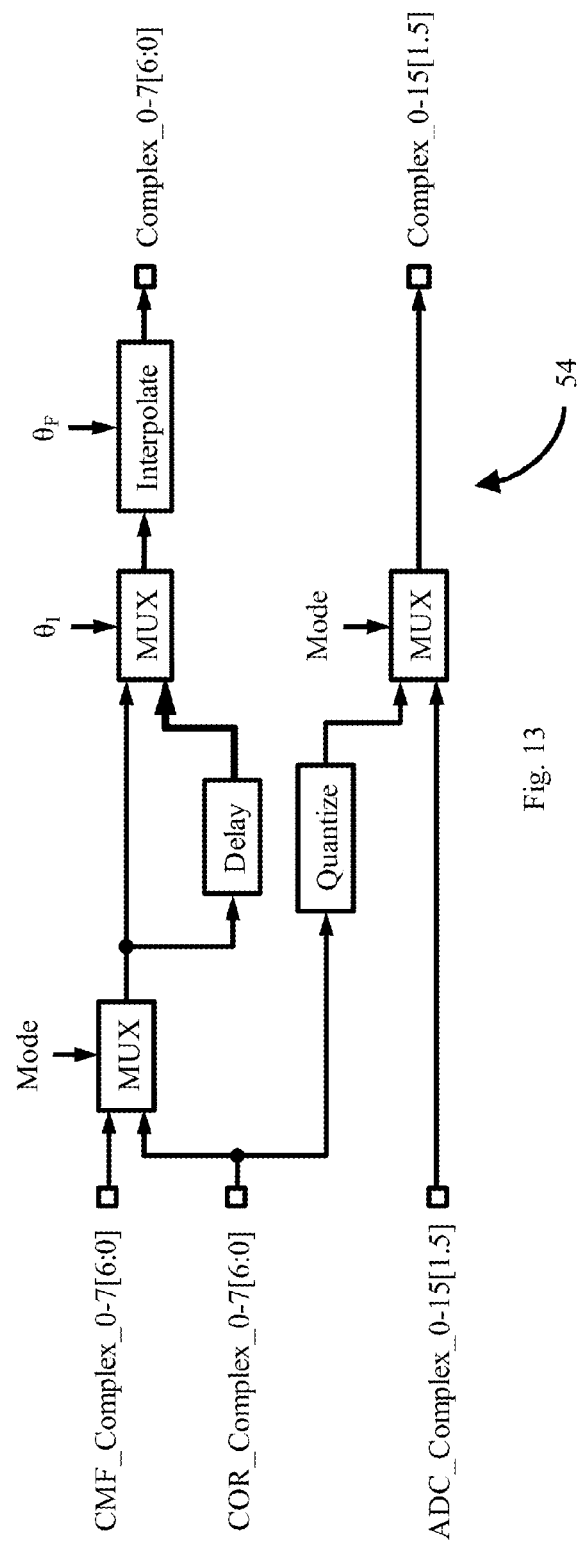
FIG. 13 illustrates, in block diagram form, a resampler adapted for use with our timing recovery loop shown in FIG. 12.

Timing loop filter accumulator 64c accumulates the lower noise estimate of the timing phase error to track the timing phase error and adjust the sampling phase error between 0 and +15.875 samples. Timing loop filter 64 also develops phase_increment ("Inc") and phase_decrement ("Dec") signals that are used to adjust the timing in units of 16 samples because they either drop or add a clock cycle delay in the accumulator 26 (during acquisition) or despreader 40 (during demodulation). Therefore, if an adjustment of −2.5 samples is required, then phase_inc is used to introduce an offset of −16 samples, while the phase error driving resampler 40 will apply a correction of +13.5 samples, giving the overall required phase adjustment of −2.5 samples. Similarly, for example, an adjustment of +19.125 samples may be achieved by applying a +16 sample adjustment with the phase_dec signal, followed by an additional +3.125 sample correction in the resampler 54. By way of illustration, a suitable embodiment of resample 54 is illustrated in FIG. 13.

The carrier recovery loop needs to lock quickly in order to successfully receive the signal, whereas the timing recovery loop can take longer. As a result, if the carrier recovery loop fails to lock soon after the preamble is found, then the preamble will be rejected, allowing the carrier recovery loop another chance to lock. The timing recovery loop, however, does not get a second chance, so, to improve the chances of lock, the timing recovery loop can be seeded with an estimate based on the carrier loop integrator. Preferably, seeding is enabled via the use of a control signal: if the state of this signal is, e.g., logic_0, then timing seeding does not take place and the gearing table (see, below) must be set up to allow for this (initially wide bandwidth to allow acquisition, then narrowing as the lock improves); but, if the state of this signal is, e.g., logic_1, then timing seeding is enabled and the loop is assumed close to lock from the outset, and a more aggressive gearing table can be used. In our preferred embodiment, seeding is enabled by default.

We have determined that the value of the loop integrator in the carrier recovery loop can be used to seed the loop integrator in the timing recovery loop, thereby giving the timing recovery loop a jump start and enhancing the chances of it locking. The formula we prefer to use to compute the seed value is:

$$I_{tim} = (\text{Scale})(I_{car})$$

where:
$I_{tim}$=timing loop integrator;
$I_{car}$=carrier loop integrator;

$$\text{Scale} = \frac{F_s}{2F_c}$$

$F_s$=sampling rate; and
$F_c$=carrier frequency.
Since $F_s$ and $F_c$ are related this is simpler in practice:

| Fc (MHz) | Channel | Scale Factor |
|---|---|---|
| 3494.4 | 1 | 1/7 |
| 3993.6 | 2.4 | 1/8 |
| 4492.8 | 3 | 1/9 |
| 6489.6 | 5.7 | 1/13 |

Figure 14:
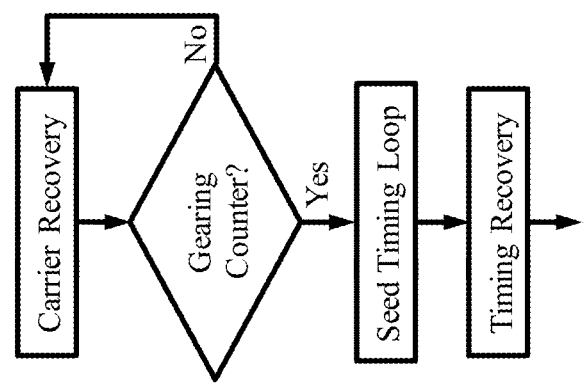
FIG. 14 illustrates, in flow diagram form, a process for seeding the timing loop filter shown in FIG. 12.
Figure 15:
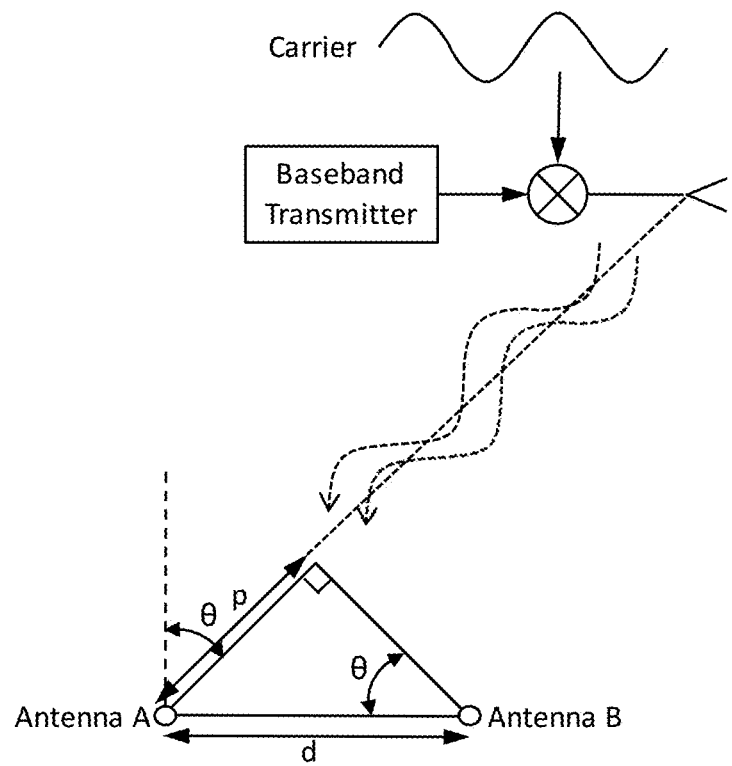
FIG. 15 illustrates, generally in topographic perspective, an RF communication system, and, in particular, illustrates the different angles of incidence of the transmitted RF signal on two antennas spaced apart by a distance d.

As shown in FIG. 14, we prefer to allow the carrier recovery loop to settle on a good quality estimate before seeding the timing recovery loop; we define the delay in terms of the carrier recovery loop gearing counter and prefer to make this threshold value programmable. Once this gearing counter threshold value is reached, the value held in the carrier recover loop integrator is scaled according to the table above (depending on the channel setting) to produce a timing seed value with the precision S[−1:−15]. Rounding does not need to be applied to this computation, just truncation, because the computation is a one-time event in the receiver 10' and does not take part in a recursive loop—therefore the bias introduced by not rounding will not accumulate to cause significant inaccuracy.

In our preferred embodiment, we implement a register-based field programmable gear shifting mechanism. Ten gears may be configured; one is reserved for demodulation mode, allowing nine acquisition gears. Each gear is assigned: a count at which it is activated; a $K_p$ value; and a $K_i$ value. Writing a value of logic_0 as the count for a gear other than the first gear terminates the gear shifting table; whilst still switching to the demodulation gear when the acquisition phase is over. Note that two sets of demodulation coefficients must be specified, one for the 110 Kbps data rate case, and one for the 850K and 6.81 Mbps cases. The default values for each of the available programmable registers are given in the following table:

TABLE 4

Timing Estimator Default Programmable Gear Shifting Register Values

| Register | Value | Default Count [9:0] | Default $K_i$ [14:10] | Default $K_p$ [19:15] |
|---|---|---|---|---|
| TR0 | 0XF8000 | 0 | 0 | 31 |
| TR1 | 0x8141E | 30 | 5 | 16 |
| TR2 | 0X58428 | 40 | 1 | 11 |
| TR3 | 0X00000 | 0 | 0 | 0 |
| TR3 | 0X00000 | 0 | 0 | 0 |
| TR5 | 0X00000 | 0 | 0 | 0 |
| TR6 | 0X00000 | 0 | 0 | 0 |
| TR7 | 0X00000 | 0 | 0 | 0 |
| TR8 | 0X00000 | 0 | 0 | 0 |
| TR9 | 0X5A161 | N/A | 1/8 (110 Kbps) | 11 | where:
  Value comprises a 20-bit variable expressed in hexadecimal format;
    Count comprises bits [9:0] of the Value;
    Ki comprises bits [14:10] of the Value; and
    Kp comprises bits [19:15] of the Value.
The K factors are coded as follows:

TABLE 5

Gear Shifting Register Value Decode

| | Minimum | Maximum | Decode |
|---|---|---|---|
| Count | 1 | 1023 | Sample count on which to apply gearing values |
| Ki | 0x00 | 0x1F | 0x00 = 00<br>0x01 = 1 × $2^{-7}$<br>0x1F = 31 × $2^{-7}$ |
| Kp | 0x00 | 0x1F | 0x00 = 00<br>0x01 = 1 × $2^{-7}$<br>0x1F = 31 × $2^{-7}$ |

Computing Angle of Incidence:

In a practical coherent receiver, it is necessary to track the carrier of the transmitter. For example, in the system of FIG. 16, both receivers 70 will be doing this, but because of different noise input mixed with the received signal, they will not necessarily do it identically. In, for example, the clock tracking loop shown in FIG. 3, the correlator output is accumulated to identify the channel impulse response, but before it is accumulated it is rotated by a carrier correction. Because this rotation is likely to be different in each of the receivers 70, it must be undone in order to calculate the phase difference between the two carriers. For example, with reference to FIG. 3, during an angle of incidence calculation mode, the rotator 52 can be rendered inoperative (or, alternatively, LUT 50 can be configured to output a fixed rotation of 0°); otherwise, the logic 46 works as described above. The phase difference between the two carriers is therefore the difference between the angles of the first paths in the accumulators minus the individual phase corrections that have been applied at the time the accumulation of the channel impulse response stops and is measured. FIG. 21 shows the calculated angle of arrival when repeated, using this method, on 100 separate packets. In the test, the actual angle of arrival was −5° and the antennas were separated by one wavelength. The carrier frequency used in this test was 4 GHz, and the standard deviation of the error was 2.1°.

We propose two ways to solve the ambiguity in solutions that occurs at an antenna separation of more than ½ a wavelength. First, we measure the time of arrival of the packet at each antenna. The angle of incidence that is most consistent with the measured time of arrival differences is the one chosen. Take the example shown in FIG. 18. If α is measured as −125° then there are two possible values for θ either −20° or +40°. If the signal arrived at antenna A first, then −20° is the correct but if the signal arrives at antenna B first, then +40° is correct. Second, we resolve the ambiguity is by sending two packets but at different carrier frequencies. FIG. 20 shows an example of the relationship between α and θ for two different carrier frequencies. Because the curves are different, only one of the possible solutions occurs at both carrier frequencies. For example, if θ, the angle of incidence was −50° then α at 4 GHz would be measured as +90° which could correspond to an α of either −50° or of +15°. At 6.5 GHz would be measured at −90° which could correspond to an α of either −50°, −10° or +24°. Since −50° is the only solution in common, it must be the correct one. Of course in practice, noise in the system means that the common solution will not be exactly the same so it will be necessary to choose the solution which has the smallest difference in the two sets of possible solutions.

Even if the two receivers 70a and 70b are fed from the same clock, it may happen that the delay of this clock to one receiver is different to the delay to the other receiver. In this case there will be a fixed phase difference between the carriers. However, this phase difference can be calibrated, e.g., by measuring α at a known angle of arrival and subtracted from a, before applying the formula of Eq. 6.

Rather than supplying the two different PLLs, 76a and 76b, with the common crystal 72, there are other ways to synchronize the receivers 70, e.g., the two receivers 70a and 70b could be synchronized by supplying both with a clock from a single PLL, e.g., the PLL 76a.

Generally, in a device-to-device UWB system, when measuring angle of arrival or angle of departure of an RF signal, more than one than one solution exists when calculating relative location of a source or destination of the RF signal. As an example, for a given angle θ, where the positive and negative angles of arrival are indistinguishable, two valid solutions exists—a real solution and an image solution. According to exemplary one embodiment, discriminating between this real solution and this image solution is accomplished by augmenting the angle of arrival location solution with data from a magnetometer, commonly understood by one of ordinary skill in the art as a compass. FIG. 22 illustrates, generally in topographic perspective, an RF communication system 80, and in particular, illustrates a system calculating two valid solutions to a measured angles of arrival of a transmitted RF signal. Unit 82 has received, measured and calculated the angle of arrival of an incoming RF signal as θ, but is unable to distinguish between the +θ angle and the −θ angle and is therefore is unable to distinguish between the location of the transmitting unit. Under these circumstances, two valid solutions exist: (i) solution (a), indicating the transmitting unit is forward of the receiving unit's location, and (ii) solution (b), indicating the transmitting unit is to the rear of the receiving unit's location.

Figure 16:
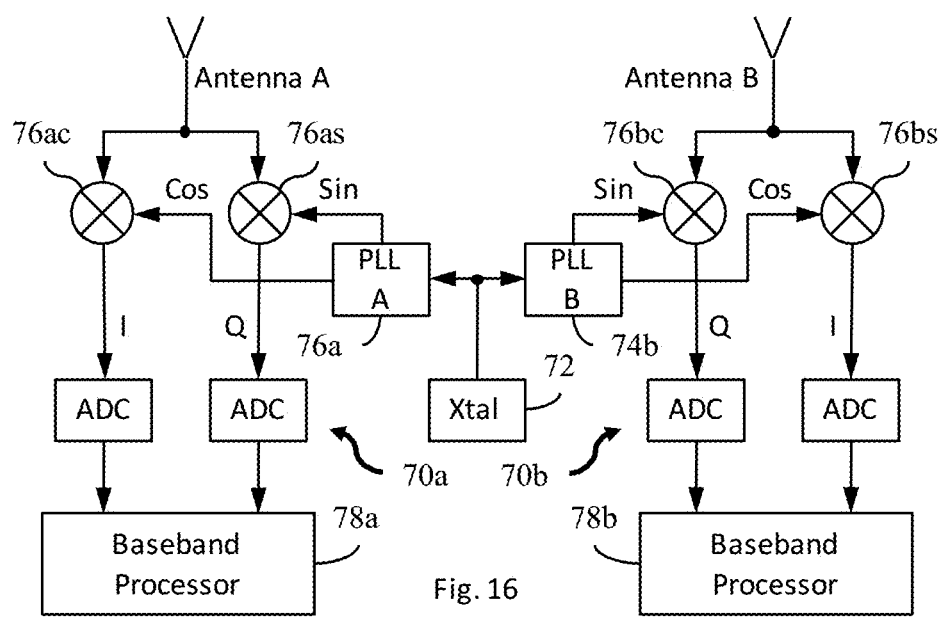
FIG. 16 illustrates, in block diagram form, the antennas of FIG. 15, together with the respective RF receivers.

FIG. 23 illustrates, in block diagram form, an RF communication unit 84 for augmenting the angle of arrival location solution comprising the respective receivers of FIG. 16 together with elements of an inertial measurement unit (IMU) and a processor. RF communication unit 84 includes receiver 70a and receiver 70b, processor 86, accelerometer 88, magnetometer 90, and gyroscope 92. According to this exemplary embodiment, discriminating between two valid location solutions is accomplished utilizing compass bearings and known unit orientation information provided by magnetometer 90 and gyroscope 92. Compass bearings may be readily acquired by way of integrated electronic magnetometer 88 as would be well understood by one of ordinary skill in the art. Likewise, orientation information may be readily acquired by way of integrated electronic gyroscope 92 as would be well understood by one of ordinary skill in the art.

FIG. 24 illustrates, generally in topographic perspective, an RF communication system 94, and in particular, illustrates two valid solutions of the source of the transmitted RF signal illustrated in FIG. 22 for a device-to-device relative location system. RF communication system 94 includes real unit A 96 and real unit B 98. Each unit comprises components substantially similar to the embodiment illustrated in FIG. 23. Real unit A 96 receives and calculates the angle of arrival of an incoming RF signal transmitted by real unit B 98 and determines two valid solutions exists for the location solution as it pertains to real unit B 98 based upon the calculated angle of arrival and distance to real unit B 98. From the perspective of real unit A 96, real unit B 98 may be forward of the location of real unit A 96, here illustrated as real unit B 98, or may be aft of the location of real unit A 96, here illustrated as image unit B 98'.

FIG. 25 further illustrates, generally in topographic perspective, the RF communication system 94, and in particular, illustrates two valid relative locations of the respective sources of the transmitted RF signal from each unit's point of view. Real unit B 98 receives and calculates the angle of arrival of an incoming RF signal transmitted by real unit A 96 and determines two valid solutions for the location solution as it pertains to real unit A 96 based upon the calculated angle of arrival and distance to real unit B 98. From the perspective of real unit B 98, real unit A 96 may be forward of the location of real unit B 98, here illustrated as real unit A 96, or may be aft of the location of real unit B 98, here illustrated as image unit A 96'.

FIG. 26 illustrates, generally in topographic perspective, the RF communication system 94, and in particular, illustrates using compass bearing to determine the correct source of the two valid relative locations of the respective sources of the transmitted RF signal. According to this embodiment, real units A 96 and B 98 utilize information provided by their respective accelerometer 88, the magnetometer 90, and the gyroscope 92 to calculate a true north compass bearing relative to respective real unit orientation, i.e., the respective real unit antennas. As discussed earlier, the real units A 96 and B 98 each measure the time of arrival of the respective RF signals transmitted and received by the respective units at each of their respective antennas, using this information to determine the respective angles of arrival. However, each unit is unable to discriminate between the +θ angle of arrival and the −θ angle of arrival, resulting in the receiving unit perceiving two valid solutions for the transmitting unit's location, i.e., here illustrated as image unit A' 96' and image unit B' 98'. Real unit A 96 and real unit B 98 exchange messages where each unit tells the other its own true north compass bearing information relative to its own orientation and the two possible angles of arrival the transmitting unit perceives the receiving unit. The receiving unit uses geometric theorem to discriminate between the real unit and the image unit.

Figure 28:
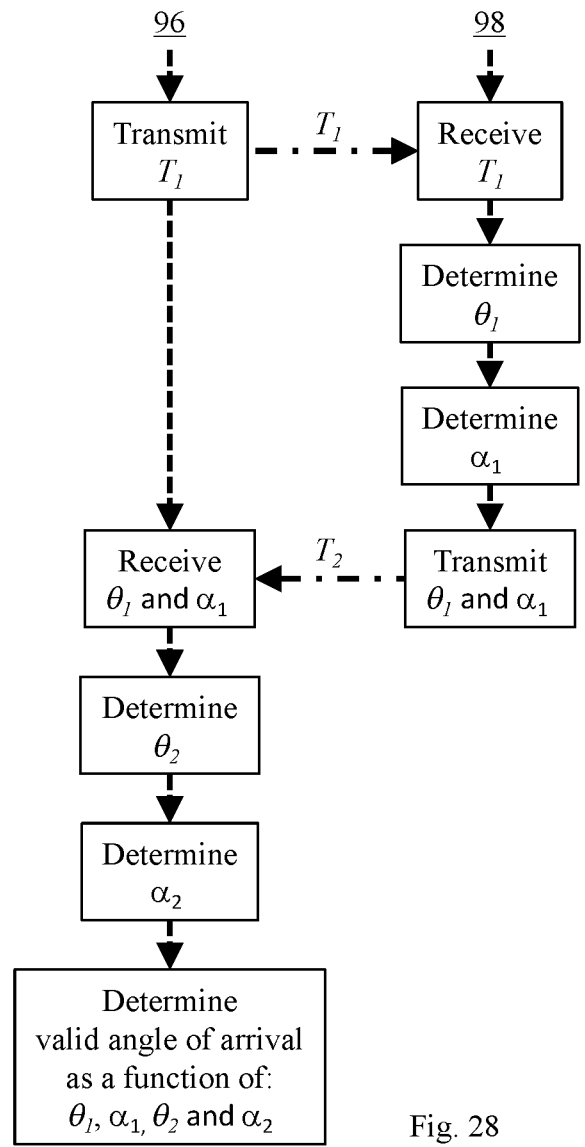
FIG. 28 illustrates, in parallel-process flow form, the method of the present invention.

For example, referring again to FIG. 26 and also to FIG. 28, assume each unit's zero axis bifurcates each unit's antennas equally and that clockwise angles from that zero line are positive angles and counter clockwise angles from that zero line are negative angles. Real unit B 98 receives a signal from real unit A 96 and determines that real unit A 96 is either located at −70° or −110°, the two solutions for the real unit B's 98 Angle of Arrival. Real unit B 98 next sends a message to real unit A 96, informing real unit A 96 that real unit B 98 perceives real unit A 96 to be located at these angles and also that true north, relative to real unit B's 98 orientation, is at a compass bearing of +50°. Real unit A 96 receives this information and calculates real unit B's 98 Angle of Arrival to be either +60° or +120° with respect to real unit A's 96 orientation, i.e., real unit A's 96 antenna. Because real unit A 96 knows that a true north bearing is at +50° with respect to real unit B 98 and that real unit A 96 is at either −70° or 110° relative to real unit B 98, real unit A 96 can eliminate the +120° solution because that solution would necessarily mean that true north would be pointing to +60° or +100° relative to real unit A's 96 orientation, but real unit A 96 knows that true north is at 0° with respect to its own orientation. In other words, the following equations provide real unit A 96 with the correct solutions:

True North=|+060|+|−070|+|+50|=180−180=0

True North=|+060|+|−110|+|+50|=220−180=40

True North=|+120|+|−070|+|+50|=240−180=60

True North=|+120|+|−110|+|+50|=280=180=100

Adding the absolute value of +60°, absolute value of −70°, and absolute value of +50° yields 180 degrees which, according to the Alternate Interior Angles Theorem of Geometry, is what the three angles should all add up to, so real unit A 96 can also rule out the 110° solution that real unit B 98 has told real unit A 96.

In an alternative embodiment, a bearing to a known fixed anchor rather than a bearing of true north would provide substantially similar results. In yet another embodiment, movement of real unit B 98 from a previously known position may be used to distinguish between the two valid solutions. The direction of movement is estimated from inertial sensors or orientation sensors provided by accelerometer 88, magnetometer 90, and gyroscope 92, as would be understood by one of ordinary skill in the art. The movement, from the perspective of real unit A 96, of the correct solution will agree more closely with the movement, estimated by real unit A 96 predicting real unit B's 98 movement, than will the movement of the image solution. As an example, in the case of a lateral movement, the correct solution and the image solution will appear to move in opposite directions between the two readings.

FIG. 27 illustrates, generally in topographic perspective, an RF communication system 80', and in particular, illustrates similar and indistinguishable angles of incidence of the transmitted RF signal, where the antennas have undergone a roll in their relative positions. The illustrated embodiment is similar to the embodiment illustrated in FIG. 22, but here, unit 82' is subjected to a change in orientation, e.g., "roll". This roll reduces the effective distance between the antennas relative to the arriving UWB radio signal. The orientation can be detected by employing an IMU and compensated for in the calculation of the angle of arrival.

Although we have described our invention in the context of particular embodiments, one of ordinary skill in this art will readily realize that many modifications may be made in such embodiments to adapt either to specific implementations. By way of example, it will take but little effort to adapt our invention for use with a different ADC scheme when it can be anticipated that the target application will not be subject to significant levels of in-channel CW interference. Further, the several elements described above may be implemented using any of the various known semiconductor manufacturing methodologies, and, in general, be adapted so as to be operable under either hardware or software control or some combination thereof, as is known in this art. Alternatively, the several methods of our invention as disclosed herein in the context of special purpose receiver apparatus may be embodied in computer readable code on a suitable computer readable medium such that when a general or special purpose computer processor executes the computer readable code, the processor executes the respective method.

Thus it is apparent that we have provided an improved method and apparatus for use in the receiver of a UWB communication system to determine angle of incidence. In particular, we submit that such a method and apparatus should provide performance generally comparable to the best prior art techniques but more efficiently than known implementations of such prior art techniques.

What we claim is:

1. In an RF system (94) comprising a first transceiver (96) and a second transceiver (98), a method comprising the steps of:
 [1] in the first transceiver (96), transmitting a first RF signal, T1;
 [2] in the second transceiver (98):
  [2.1] receiving the first RF signal, T1;
  [2.2] determining a first angle of arrival, $\theta_1$, of the received first RF signal, wherein $\theta_1$ comprises first and second possible valid angles of arrival, $+\theta_1$ and $-\theta_1$, respectively;
  [2.3] determining a first bearing, $\alpha_1$, of a predetermined anchor relative to the second transceiver (98); and
  [2.4] transmitting via a second RF signal, T2, the first angle of arrival, $\theta_1$, and the first bearing; and
 [3] in the first transceiver (96):
  [3.1] receiving via the second RF signal, T2, the first angle of arrival, $\theta_1$, and the first bearing;
  [3.2] determining a second angle of arrival, $\theta_2$, of the received second RF signal, wherein $\theta_2$ comprises third and fourth possible valid angles of arrival, $+\theta_2$ and $-\theta_2$, respectively;
  [3.3] determining a second bearing, $\alpha_2$, of the predetermined anchor relative to the first transceiver (96); and
  [3.4] determining a valid one of the third and fourth possible valid angles of arrival as a function of: the first angle of arrival, $\theta_1$; the first bearing; the second angle of arrival, $\theta_2$; and the second bearing.

2. The method of claim 1 wherein:
 said first bearing is further characterized as a compass bearing to a known fixed anchor relative to an orientation of the second transceiver; and
 said second bearing is further characterized as a compass bearing of said known fixed anchor relative to an orientation of the first transceiver.

3. The method of claim 2 wherein said known fixed anchor is true north.

4. A transceiver adapted to:
 transmit a first RF signal;
 receive via a second RF signal, a first angle of arrival, and a first bearing;
 determine a second angle of arrival, of the second RF signal, wherein the second angle of arrival comprises a third and a fourth possible valid angles of arrival;
 determine a second bearing of an anchor relative to the transceiver; and
 determine a valid one of the third and the fourth possible valid angles of arrival as a function of the first angle of arrival, the first bearing, the second angle of arrival, and the second bearing.

5. An RF system comprising:
 a first transceiver comprising:
  a first transmitter; and
  a first receiver;
 said first transceiver adapted to perform the steps in claim 1 of the first transceiver; and
 a second transceiver comprising:
  a second transmitter; and
  a second receiver;
 said second transceiver adapted to perform the steps in claim 1 of the second transceiver.

6. A non-transitory computer readable medium including executable instructions which, when executed in an RF system comprising a first transceiver (96) and a second transceiver (98), causes the RF system to perform the steps of a method according to any one of claims 1 to 3.

\* \* \* \* \*